(12) United States Patent
Kamijima et al.

(10) Patent No.: US 7,682,923 B2
(45) Date of Patent: Mar. 23, 2010

(54) METHOD OF FORMING METAL TRENCH PATTERN IN THIN-FILM DEVICE

(75) Inventors: Akifumi Kamijima, Tokyo (JP); Hideyuki Yatsu, Tokyo (JP)

(73) Assignee: TDK Corporation, Tokyo (JP)

( * ) Notice: Subject to any disclaimer, the term of this patent is extended or adjusted under 35 U.S.C. 154(b) by 118 days.

(21) Appl. No.: 11/967,905

(22) Filed: Dec. 31, 2007

(65) Prior Publication Data
US 2009/0170274 A1  Jul. 2, 2009

(51) Int. Cl.
*H01L 21/20* (2006.01)
(52) U.S. Cl. .................. 438/386; 438/387; 438/243; 438/244
(58) Field of Classification Search .................. None
See application file for complete search history.

(56) References Cited

U.S. PATENT DOCUMENTS

| 5,484,516 | A | * | 1/1996 | Funahashi et al. ............. 205/50 |
| 6,207,524 | B1 | | 3/2001 | Gutsche |
| 6,372,111 | B1 | * | 4/2002 | Watts ......................... 205/101 |
| 6,765,756 | B1 | * | 7/2004 | Hong et al. ............. 360/125.43 |
| 2003/0189788 | A1 | * | 10/2003 | Kamijima .................. 360/126 |
| 2008/0096389 | A1 | * | 4/2008 | Feng et al. .................. 438/692 |

FOREIGN PATENT DOCUMENTS

| JP | A-6-291024 | 10/1994 |
| JP | A-7-106325 | 4/1995 |
| JP | A-9-246219 | 9/1997 |
| JP | A-2001-185473 | 7/2001 |

* cited by examiner

*Primary Examiner*—Ha Tran T Nguyen
*Assistant Examiner*—Shantanu C Pathak
(74) *Attorney, Agent, or Firm*—Oliff & Berridge, PLC

(57) ABSTRACT

A method of forming a metal trench pattern in a thin-film device includes a step of depositing an electrode film on a substrate or on a base layer, a step of forming a resist pattern layer having a trench forming portion used to make a trench pattern, on the deposited electrode film, a step of forming a metal layer for filling spaces in the trench forming portion and for covering the trench forming portion, by performing plating through the formed resist pattern layer using the deposited electrode film as an electrode, a step of planarizing at least a top surface of the formed metal layer until the trench forming portion of the resist pattern layer is at least exposed, and a step of removing the exposed trench forming portion of the resist pattern layer.

25 Claims, 25 Drawing Sheets

METHOD OF FORMING METAL TRENCH PATTERN IN THIN-FILM DEVICE

BACKGROUND OF THE INVENTION

1. Field of the Invention

The present invention relates to a method of forming a metal trench pattern in a thin-film device and to a manufacturing method of a thin-film device.

2. Description of the Related Art

When manufacturing a thin-film device with a metal trench pattern such as a trench capacitor for example, in general, recesses or trenches are first formed and then an adjacent space layer is deposited on top surfaces around the recesses in order to self-align a height of a top surface of opening edges of the recesses with a height of the top surfaces of the adjacent spaces around the recesses. U.S. Pat. No. 6,207,524 B1 discloses such method for manufacturing a semiconductor memory cell with a trench capacitor.

However, if the deposition is done to form an adjacent space layer around recesses after forming these recesses, the layer will be also deposited in the recesses and the deposited layer once formed in the recesses will be difficult to completely remove. Particularly, in case that the trench is deep, it may be impossible to remove the deposited layer in the trench. If such unnecessary deposited layer is remained in the recesses, it may be impossible to keep a precise shape of the trench as desired. In such case, it will be difficult to fabricate, by utilizing the trench pattern, a trench capacitor with high precision and high quality.

To solve such problem in the conventional art, the assignee of the present application has proposed a method of forming a recess pattern in Japanese Patent Application No. 2007-089644, filed on Mar. 29, 2007. According to the proposed method, openings of a metal trench pattern are covered by a dry resist film to prevent an adjacent space layer from being deposited in the recesses. It should be noted that this Japanese Patent Application No. 2007-089644 had not published when the present invention was invented and also when the present application was filed.

However, according to this recess pattern forming method proposed by the assignee of the present application, since the dry resist film or resist pattern is removed just after the metal trench pattern is formed, the most part in the recesses is remained hollow during the following processes. This causes convex portions or pillars that form the trench there between to easily deform or to topple over, particularly when the trench is deep.

SUMMARY OF THE INVENTION

It is therefore an object of the present invention to provide a method of forming a metal trench pattern in a thin-film device and a manufacturing method of a thin-film device, whereby unnecessary material can be prevented from being deposited in recesses of the trench pattern.

Another object of the present invention is to provide a method of forming a metal trench pattern in a thin-film device and a manufacturing method of a thin-film device, whereby convex portions or pillars that form the trench pattern can be prevented from being deformed.

According to the present invention, a method of forming a metal trench pattern in a thin-film device includes a step of depositing an electrode film on a substrate or on a base layer, a step of forming a resist pattern layer having a trench forming portion used to make a trench pattern, on the deposited electrode film, a step of forming a metal layer for filling spaces in the trench forming portion and for covering the trench forming portion, by performing plating through the formed resist pattern layer using the deposited electrode film as an electrode, a step of planarizing at least a top surface of the formed metal layer until the trench forming portion of the resist pattern layer is at least exposed, and a step of removing the exposed trench forming portion of the resist pattern layer.

Since the concave portions or recesses in the trench pattern are filled with the resist layer until the planarization is finished, it is possible to prevent slurry used in planarization or lapped material from entering into the spaces or recesses of the trench pattern and also to prevent the convex portions or pillars that configure the trench pattern by sandwiching the spaces or recesses there between from being deformed or toppled over.

It is preferred that the method further includes a step of removing a part of the resist pattern layer and a part of the electrode film, which are uncovered by the formed metal layer, and a step of depositing a peripheral area layer on the metal layer, and that the planarizing step includes planarizing top surfaces of the formed metal layer and the deposited peripheral area layer until the trench forming portion of the resist pattern layer is at least exposed. In this case, preferably, the step of depositing a peripheral area layer includes depositing an insulation layer.

It is also preferred that the planarizing step includes planarizing a top surface of only the formed metal layer until the trench forming portion of the resist pattern layer is at least exposed.

According to the present invention, also, a method of forming a metal trench pattern in a thin-film device, includes a step of depositing an electrode film on a substrate or on a base layer, a step of forming a resist pattern layer having a trench forming portion used to make a trench pattern, on the deposited electrode film, a step of forming a first metal layer made of a first metal material for filling spaces in the trench forming portion, by performing plating through the formed resist pattern layer using the deposited electrode film as an electrode, a step of forming a second metal layer made of a second metal material for covering at least the trench forming portion, by performing plating through the formed resist pattern layer using the deposited electrode film as an electrode, the second metal material having a higher chemical activity than that of the first metal material, a step of planarizing at least a top surface of the formed second metal layer just before the trench forming portion of the resist pattern layer is exposed, a step of removing the second metal layer to expose the trench forming portion of the resist pattern layer, and a step of removing the exposed trench forming portion of the resist pattern layer.

Since the concave portions or recesses in the trench pattern are filled with the second metal layer and the resist layer until the planarization is finished, it is possible to prevent slurry used in planarization or lapped material from entering into the spaces or recesses of the trench pattern. Furthermore, since the concave portions or recesses in the trench pattern are filled with not only the resist layer but also the second metal layer until the planarization is finished, it is possible to securely support convex portions or pillars that configure the trench pattern by sandwiching the concave portions or recesses there between so as to effectively prevent these convex portions or pillars from being deformed or toppled over.

It is preferred that the method further includes a step of removing a part of the resist pattern layer and a part of the electrode film, which are uncovered by the formed first and second metal layers, and a step of depositing a peripheral area layer on the second metal layer, and that the planarizing step includes planarizing top surfaces of the formed second metal layer and the deposited peripheral area layer just before the trench forming portion of the resist pattern layer is exposed. In this case, preferably, the step of depositing a peripheral area layer includes depositing an insulation layer.

It is also preferred that the planarizing step includes planarizing a top surface of only the formed second metal layer just before the trench forming portion of the resist pattern layer is exposed.

According to the present invention, further, a method of forming a metal trench pattern in a thin-film device, includes a step of depositing an electrode film on a substrate or on a base layer, a step of forming a resist pattern layer having a trench forming portion used to make a trench pattern, on the deposited electrode film, a step of forming a first metal layer made of a first metal material for filling spaces in the trench forming portion, by performing plating through the formed resist pattern layer using the deposited electrode film as an electrode, a step of shaving by an ashing process a top surface of the formed resist pattern layer, a step of forming a second metal layer made of a second metal material for covering at least the trench forming portion, by performing plating through the shaved resist pattern layer using the deposited electrode film as an electrode, the second metal material having a higher chemical activity than that of the first metal material, a step of planarizing top surfaces of the formed first and second metal layers just before the trench forming portion of the resist pattern layer is exposed, a step of removing the second metal layer to expose the trench forming portion of the resist pattern layer, and a step of removing the exposed trench forming portion of the resist pattern layer.

Since the concave portions or recesses in the trench pattern are filled with the second metal layer and the resist layer until the planarization is finished, it is possible to prevent slurry used in planarization or lapped material from entering into the spaces or recesses of the trench pattern. Furthermore, since the concave portions or recesses in the trench pattern are filled with not only the resist layer but also the second metal layer until the planarization is finished, it is possible to securely support convex portions or pillars that configure the trench pattern by sandwiching the concave portions or recesses there between so as to effectively prevent these convex portions or pillars from being deformed or toppled over.

It is preferred that the method further includes a step of removing a part of the resist pattern layer and a part of the electrode film, which are uncovered by the formed first and second metal layers, and a step of depositing a peripheral area layer on the second metal layer, and that the planarizing step includes planarizing top surfaces of the formed first and second metal layers and of the deposited peripheral area layer just before the trench forming portion of the resist pattern layer is exposed. In this case, preferably, the step of depositing a peripheral area layer includes depositing an insulation layer.

It is also preferred that the planarizing step includes planarizing top surfaces of only the formed first and second metal layers just before the trench forming portion of the resist pattern layer is exposed.

According to the present invention, still further a manufacturing method of a thin-film device, includes a step of depositing an electrode film on a substrate or on a base layer, a step of forming a resist pattern layer having a trench forming portion used to make a trench pattern, on the deposited electrode film, a step of forming a metal layer for filling spaces in the trench forming portion and for covering the trench forming portion, by performing plating through the formed resist pattern layer using the deposited electrode film as an electrode, a step of planarizing at least a top surface of the formed metal layer until the trench forming portion of the resist pattern layer is at least exposed, and a step of removing the exposed trench forming portion of the resist pattern layer.

It is preferred that the method further includes a step of depositing a dielectric film on the surface of the metal layer after the removing step of the resist pattern layer, and a step of depositing an upper electrode film on a surface of the dielectric film.

It is also preferred that the method further includes a step of removing a part of the resist pattern layer and a part of the electrode film, which are uncovered by the formed metal layer, and a step of depositing a peripheral area layer on the metal layer, and that the planarizing step includes planarizing top surfaces of the formed metal layer and the deposited peripheral area layer until the trench forming portion of the resist pattern layer is at least exposed. In this case, preferably, the step of depositing a peripheral area layer includes depositing an insulation layer.

It is further preferred that the planarizing step includes planarizing a top surface of only the formed metal layer until the trench forming portion of the resist pattern layer is at least exposed.

According to the present invention, still further, a manufacturing method of a thin-film device, includes a step of depositing an electrode film on a substrate or on a base layer, a step of forming a resist pattern layer having a trench forming portion used to make a trench pattern, on the deposited electrode film, a step of forming a first metal layer made of a first metal material for filling spaces in the trench forming portion, by performing plating through the formed resist pattern layer using the deposited electrode film as an electrode, a step of forming a second metal layer made of a second metal material for covering at least the trench forming portion, by performing plating through the formed resist pattern layer using the deposited electrode film as an electrode, the second metal material having a higher chemical activity than that of the first metal material, a step of planarizing at least a top surface of the formed second metal layer just before the trench forming portion of the resist pattern layer is exposed, a step of removing the second metal layer to expose the trench forming portion of the resist pattern layer, and a step of removing the exposed trench forming portion of the resist pattern layer.

It is preferred that the manufacturing method further includes a step of depositing a dielectric film on the surface of the first metal layer after the removing step of the resist pattern layer, and a step of depositing an upper electrode film on a surface of the dielectric film.

It is also preferred that the manufacturing method further includes a step of removing a part of the resist pattern layer and a part of the electrode film, which are uncovered by the formed first and second metal layers, and a step of depositing a peripheral area layer on the second metal layer, and that the planarizing step includes planarizing top surfaces of the formed second metal layer and the deposited peripheral area layer just before the trench forming portion of the resist pattern layer is exposed. In this case, preferably, the step of depositing a peripheral area layer includes depositing an insulation layer.

It is further preferred that the planarizing step includes planarizing a top surface of only the formed second metal layer just before the trench forming portion of the resist pattern layer is exposed.

According to the present invention, a manufacturing method of a thin-film device, includes a step of depositing an electrode film on a substrate or on a base layer, a step of forming a resist pattern layer having a trench forming portion used to make a trench pattern, on the deposited electrode film, a step of forming a first metal layer made of a first metal material for filling spaces in the trench forming portion, by performing plating through the formed resist pattern layer using the deposited electrode film as an electrode, a step of shaving by an ashing process a top surface of the formed resist pattern layer, a step of forming a second metal layer made of a second metal material for covering at least the trench forming portion, by performing plating through the shaved resist pattern layer using the deposited electrode film as an electrode, the second metal material having a higher chemical activity than that of the first metal material, a step of planarizing top surfaces of the formed first and second metal layers just before the trench forming portion of the resist pattern layer is exposed, a step of removing the second metal layer to expose the trench forming portion of the resist pattern layer, and a step of removing the exposed trench forming portion of the resist pattern layer.

It is preferred that the manufacturing method further includes a step of depositing a dielectric film on the surface of the first metal layer after the removing step of the resist pattern layer, and a step of depositing an upper electrode film on a surface of the dielectric film.

It is also preferred that the manufacturing method further includes a step of removing a part of the resist pattern layer and a part of the electrode film, which are uncovered by the formed first and second metal layers, and a step of depositing a peripheral area layer on the second metal layer, and that the planarizing step includes planarizing top surfaces of the formed first and second metal layers and of the deposited peripheral area layer just before the trench forming portion of the resist pattern layer is exposed. In this case, preferably, the step of depositing a peripheral area layer includes depositing an insulation layer.

It is further preferred that the planarizing step includes planarizing top surfaces of only the formed first and second metal layers just before the trench forming portion of the resist pattern layer is exposed.

Further objects and advantages of the present invention will be apparent from the following description of the preferred embodiments of the invention as illustrated in the accompanying drawings.

DESCRIPTION OF THE PREFERRED EMBODIMENTS

FIGS. 1a to 1h and FIGS. 2a to 2j schematically illustrate a part of processes in a first embodiment of a method of forming a metal trench pattern according to the present invention. In FIGS. 1a to 1h, the structure of a trench-forming portion of a resist pattern layer is simplified for the sake of clarity.

Hereinafter, in reference to these figures, a manufacturing process in this first embodiment will be described. Although a trench capacitor is fabricated as a thin-film device in this embodiment, the trench pattern forming method of this first embodiment can be utilized for fabricating another thin-film device such as Micro Electro Mechanical System (MEMS) for example.

Figure 2A:
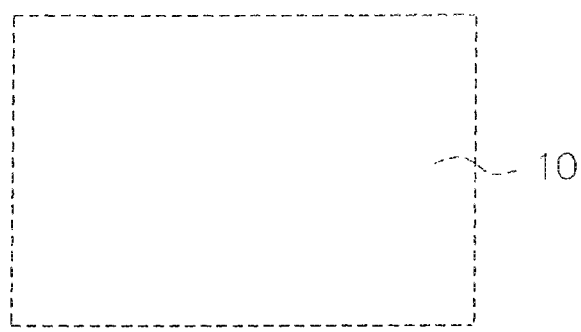
FIGS. 2a to 2j show plane views schematically illustrating a part of processes in the first embodiment shown in FIGS. 1a to 1h.

First, as shown in FIG. 2a, a substrate 10 is provided. As for the substrate 10, used is an alumina ($Al_2O_3$) substrate with a diameter of 6 inches and a thickness of 2 mm in this embodiment.

Figure 2B:
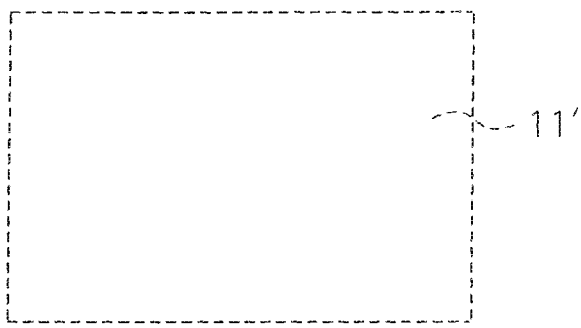

Then, as shown in FIG. 2b, an electrode film 11' that is a seed film for plating is deposited on the whole area of the substrate 10 or on a base layer formed on the substrate 10. The deposition of the electrode film 11' will be performed by sputtering or by vapor deposition of a metal material with a good conductivity such as nickel (Ni) or else to have a thickness of about 100 nm.

Figure 1A:
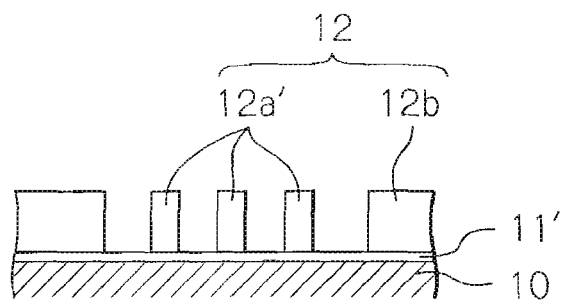
FIGS. 1a to 1h show sectional views schematically illustrating a part of processes in a first embodiment of a method of forming a metal trench pattern according to the present invention.
Figure 2C:
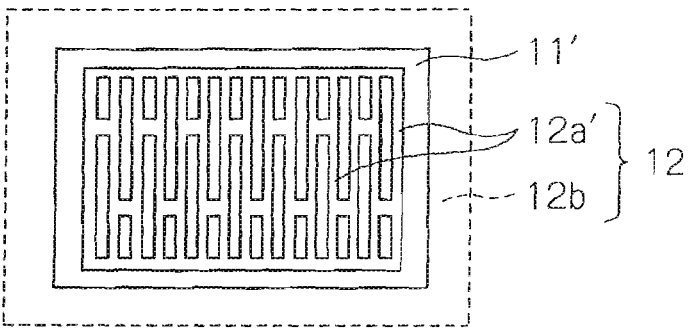

Then, as shown in FIGS. 1a and 2c, a resist pattern layer 12 is formed. This resist pattern layer 12 is constituted by a trench forming portion 12a' having a predetermined trench pattern and an outer frame portion 12b.

The resist pattern layer 12 will be formed as follows. First, a resist film having a thickness of about 21 μm is formed by performing spin-coat of a liquid resist material such as for example SIPR-7100 of Shin-Etsu Chemical Co., Ltd. Thereafter, the formed resist film is pre-baked, exposed and then developed with the following conditions. The pre-baking is 100° C.×60 seconds. As for a pattern exposure machine, for example NSR-i12TFH ($\lambda$=365 nm, NA=0.3, $\sigma$=0.3) of Nikon Corporation is used. Exposure amount is 350 mJ/cm². PEB is 130° C.×360 seconds. As for a developer, an aqueous solution of 2.38% Tetramethylammonium hydroxide (TMAH) is used. The development is performed for 60 seconds×5 times. The shape of thus obtained resist pattern layer 12, particularly that of the trench forming portion 12a', is line and space (L/S)

with a width of 5 μm. The outer frame portion 12b is formed around outer circumference of the trench forming portion 12a'.

Figure 1B:
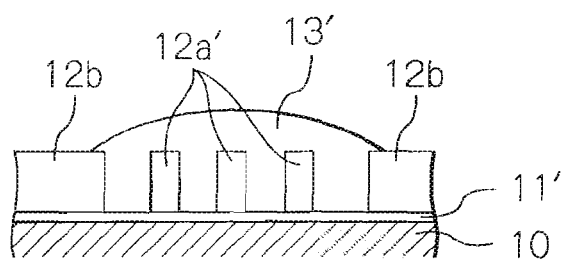
Figure 2D:
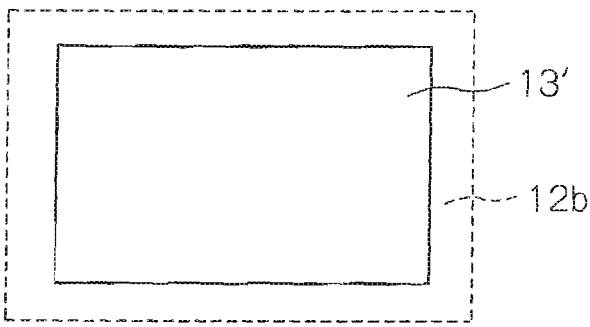

Then, a metal layer 13' with the trench pattern shown in FIGS. 1b and 2d is formed by performing a flame plating using this resist pattern layer 12 and the electrode film 11'. The frame plating is conducted for a long period of time so that nickel (Ni) or other metal material for example is plated using a Ni-bath (Watt bath) for example to have a thickness of about 21 μm, and that not only spaces in the trench forming portion 12a' of the resist pattern layer 12 is filled with the metal layer 13' but also the trench forming portion 12a' is completely covered by the metal layer 13', in other words, the trench forming portion 12a' is buried in the metal layer 13'. Instead of a long time period of plating or with a long time period of plating, increased plating current and/or increased metal-ion density of plating solution may be employed.

Figure 1C:
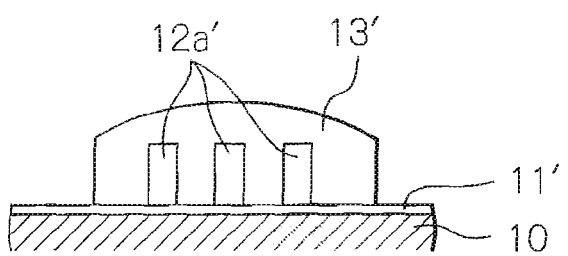
Figure 2E:
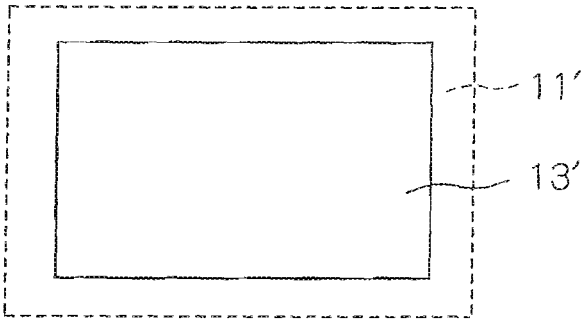

Then, as shown in FIGS. 1c and 2e, the outer frame portion 12b of the resist pattern 12, which is uncovered by the metal layer 13' is removed. This removal may be performed by immersing the substrate into an organic solution such as for example propanol isopropyl alcohol (IPL) or N-methyl-2-pyrrolydone (NMP) and by rocking the immersed substrate.

Figure 1D:
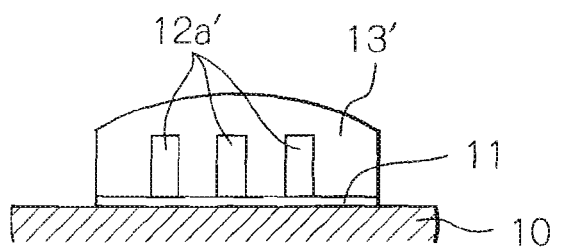
Figure 2F:
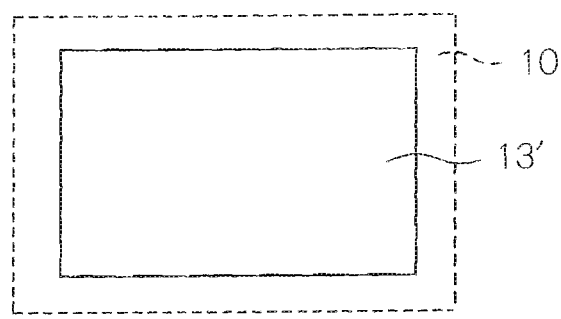

Then, as shown in FIGS. 1d and 2f, an area of the electrode film 11', which is uncovered by the metal layer 13' is removed by ion milling to partially remain the electrode film 11 only under the metal layer 13'. In this embodiment, the ion milling may be performed using a milling device such as for example IML of Hitachi, Ltd. Argon (Ar) gas may be used as for the milling gas and a milling current of 300 mA may be used. Instead of ion milling, a reactive ion etching (RIE) or a wet etching may be performed.

Figure 1E:
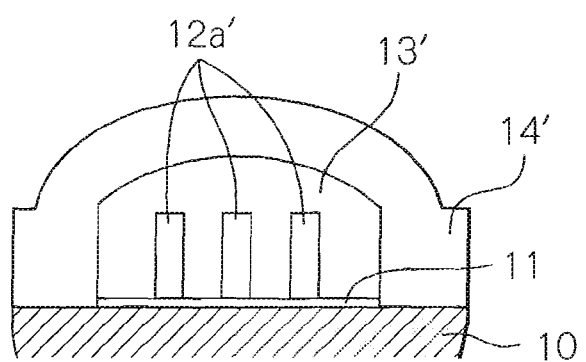
Figure 2G:
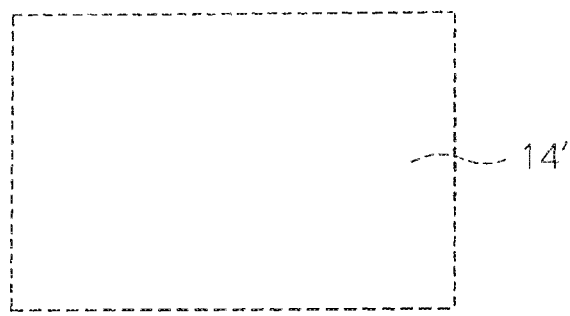

Then, as shown in FIGS. 1e and 2g, an insulation layer 14' is deposited as for a peripheral area layer, over the metal layer 13'. The insulation layer 14' may be formed by performing sputtering of an insulation material such as for example $Al_2O_3$ to have a thickness of about 25 μm. In this embodiment, the sputtering may be performed using a bias-sputtering device of for example Hitachi, Ltd. A target of $Al_2O_3$ may be used and Ar gas may be used as for the sputtering gas.

Figure 1F:
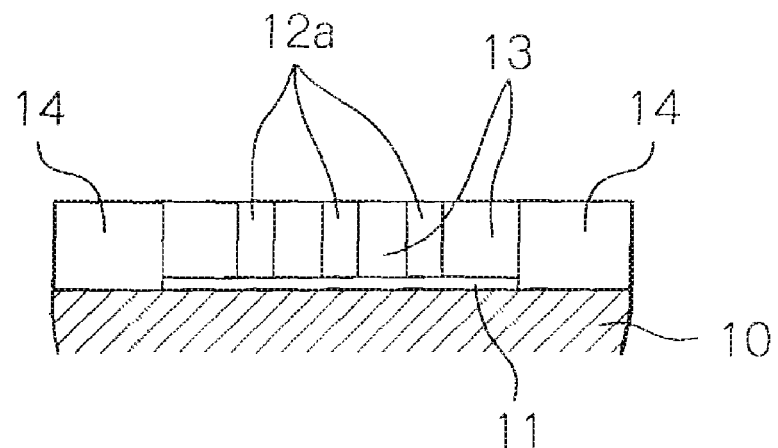
Figure 2H:
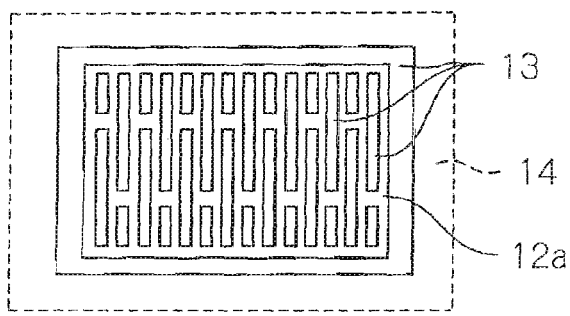

Thereafter, surfaces of the deposited insulation layer 14', of the metal layer 13', and of the trench forming portion 12a' of the resist pattern are planarized together by performing a chemical mechanical polishing (CMP). In this embodiment, the CMP may be performed using a CMP device such as for example MIRRA of Applied Materials Inc. In the CMP process, a urethane pad is used with aluminum slurry having a grain diameter of 250 nm. This planarization process will be continued until the trench forming portion 12a' of the resist pattern layer is exposed. As a result, as shown in FIGS. 1f and 2h, an insulation layer 14, a metal layer 13, and a trench forming portion 12a of the resist pattern, with top surfaces planarized flat together in the same plane.

Figure 1G:
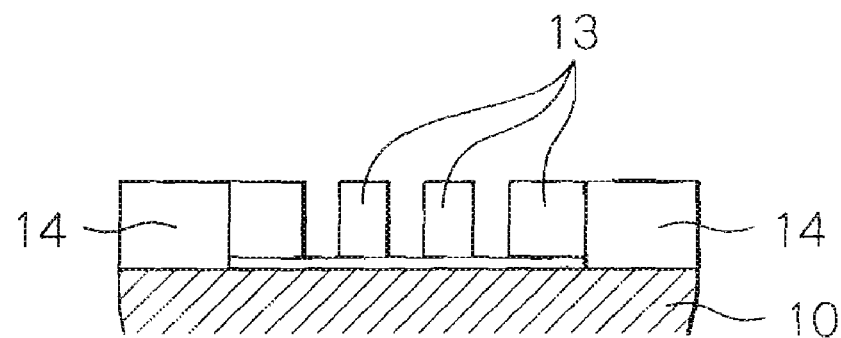
Figure 2I:
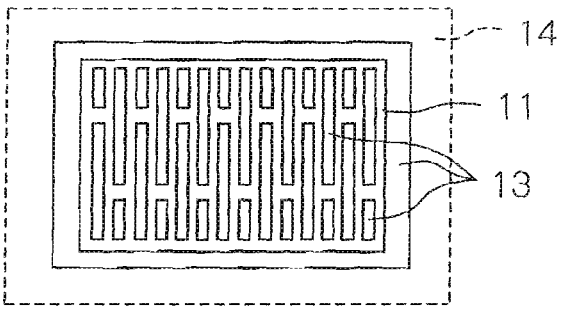

Then, as shown in FIGS. 1g and 2i, the trench forming portion 12a of the resist pattern is removed. This removal may be performed by immersing the substrate into an organic solution such as for example IPL or NMP and by rocking the immersed substrate.

According to the above-mentioned processes, the metal layer 13 having a trench pattern of a plurality of convex portions or pillars arranged to sandwich concave portions or recesses with a depth of about 20 μm, surrounded by the insulation layer 14 that is a peripheral area layer, can be obtained. The convex portions or pillars of the metal layer 13 are electrically conducted with each other through the electrode film 11. Particularly, in this embodiment, since the concave portions or recesses are completely filled with the resist layer until the CMP planarization is finished, it is possible to prevent slurry used in CMP or lapped material from entering into the concave portions or recesses of the trench pattern and also to prevent the convex portions or pillars that configure the trench pattern by sandwiching the concave portions or recesses there between from being deformed or toppled over.

Figure 1H:
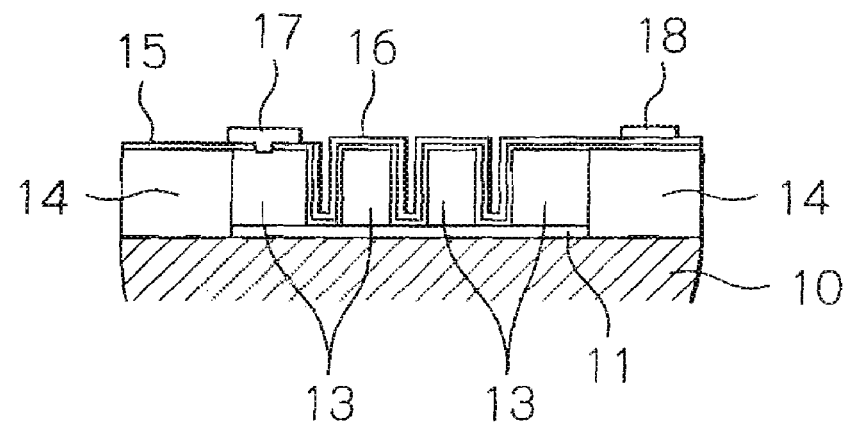
Figure 2J:
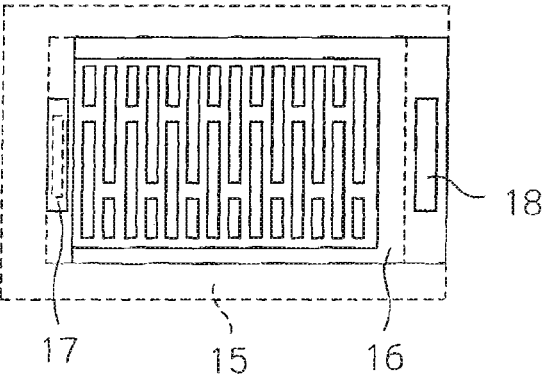

After forming such trench pattern, in this embodiment, a dielectric film 15 is formed on top surfaces of the metal layer 13 and the insulation layer 14 by depositing thereon, by sputtering, a dielectric material such as for example $Al_2O_3$ to have a thickness of about 80 nm. Then, an upper electrode film 16 is formed by depositing thereon, by sputtering, two conductive materials such as for example chrome (Cr) and copper (Cu) to have a thickness of about 10 nm and a thickness of about 500 nm, respectively. Thereafter, electrode pads 17 and 18 that are electrically connected to the metal layer 13 constituting a lower electrode and to the upper electrode film 16, respectively, are formed. As a result, as shown in FIGS. 1h and 2j, a trench capacitor is fabricated.

As described in detail, according to this embodiment, because the trench pattern is formed in a correct shape without deformation, a trench capacitor with high accuracy and high quality can be provided.

FIGS. 3a to 3i and FIGS. 4a to 4l schematically illustrate a part of processes in a second embodiment of a method of forming a metal trench pattern according to the present invention. In FIGS. 3a to 3i, the structure of a trench-forming portion of a resist pattern layer is simplified for the sake of clarity. In this embodiment, the similar components as these in the first embodiment are represented with the same reference numerals.

Hereinafter, in reference to these figures, a manufacturing process in this second embodiment will be described. Although a trench capacitor is fabricated as a thin-film device in this embodiment, the trench pattern forming method of this second embodiment can be utilized for fabricating another thin-film device such as MEMS for example.

Figure 4A:
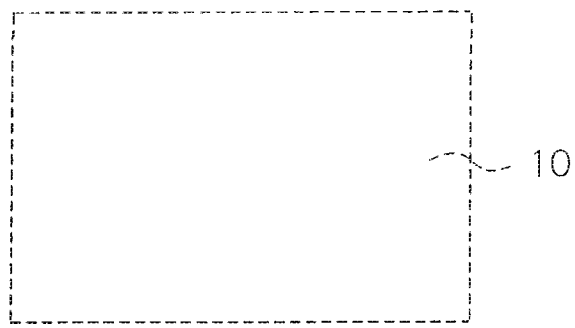
FIGS. 4a to 4l show plane views schematically illustrating a part of processes in the second embodiment shown in FIGS. 3a to 3i.

First, as shown in FIG. 4a, a substrate 10 is provided. As for the substrate 10, used is an $Al_2O_3$ substrate with a diameter of 6 inches and a thickness of 2 mm in this embodiment.

Figure 4B:
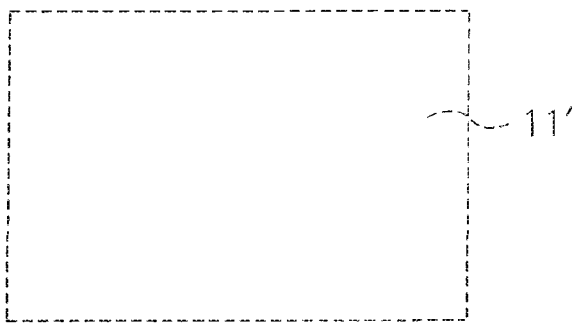

Then, as shown in FIG. 4b, an electrode film 11' that is a seed film for plating is deposited on the whole area of the substrate 10 or on a base layer formed on the substrate 10. The deposition of the electrode film 11' will be performed by sputtering or by vapor deposition of a metal material with a good conductivity such as Ni or else to have a thickness of about 100 nm.

Figure 3A:
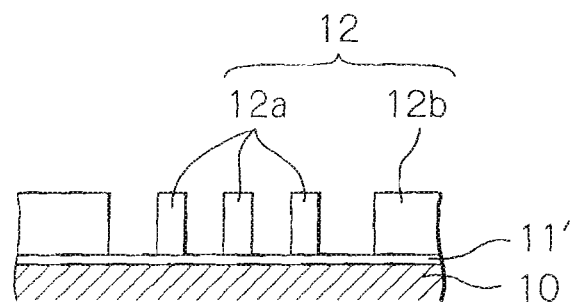
FIGS. 3a to 3i show sectional views schematically illustrating a part of processes in a second embodiment of a method of forming a metal trench pattern according to the present invention.
Figure 4C:
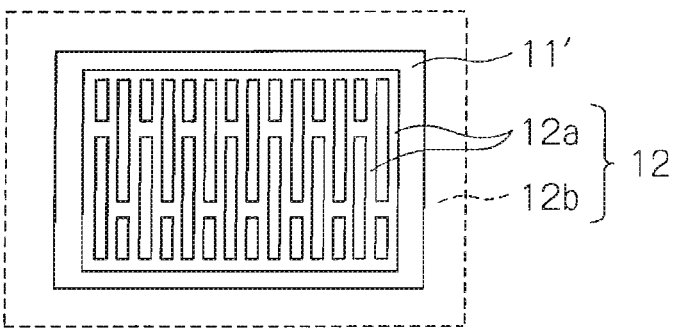

Then, as shown in FIGS. 3a and 4c, a resist pattern layer 12 is formed. This resist pattern layer 12 is constituted by a trench forming portion 12a having a predetermined trench pattern and an outer frame portion 12b.

The resist pattern layer 12 will be formed as follows. First, a resist film having a thickness of about 21 μm is formed by performing spin-coat of a liquid resist material such as for example SIPR-7100 of Shin-Etsu Chemical Co., Ltd. Thereafter, the formed resist film is pre-baked, exposed and then developed with the following conditions. The pre-baking is 100° C.×60 seconds. As for a pattern exposure machine, for example NSR-i12TFH ($\lambda$=365 nm, NA=0.3, $\sigma$=0.3) of Nikon Corporation is used. Exposure amount is 350 mJ/cm². PEB is 130° C.×360 seconds. As for a developer, an aqueous solution of 2.38% TMAH is used. The development is performed for 60 seconds×5 times. The shape of thus obtained resist pattern layer 12, particularly that of the trench forming portion 12a, is line and space (L/S) with a width of 5 μm. The outer frame portion 12b is formed around outer circumference of the trench forming portion 12a.

Figure 3B:
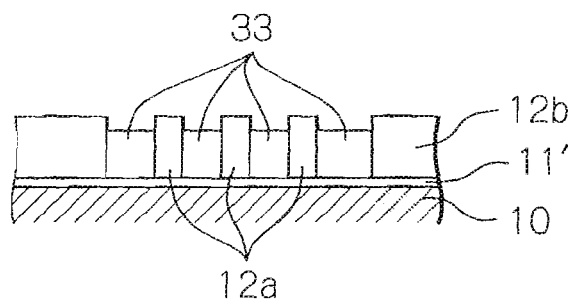
Figure 4D:
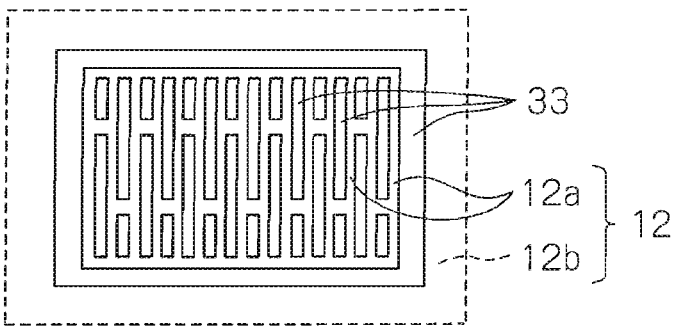

Then, a first metal layer 33 with the trench pattern shown in FIGS. 3b and 4d is formed by performing a flame plating using this resist pattern layer 12 and the electrode film 11'. This frame plating is performed so that Ni or other metal material for example is plated using a Watt bath for example to have a thickness of about 20 μm, and that spaces in the trench forming portion 12a of the resist pattern layer 12 are partially filled with the first metal layer 33 but top surfaces of the first metal layer 33 are lower than a top of the trench forming portion 12a, in other words, the top end of the trench forming portion 12a is exposed.

Figure 3C:
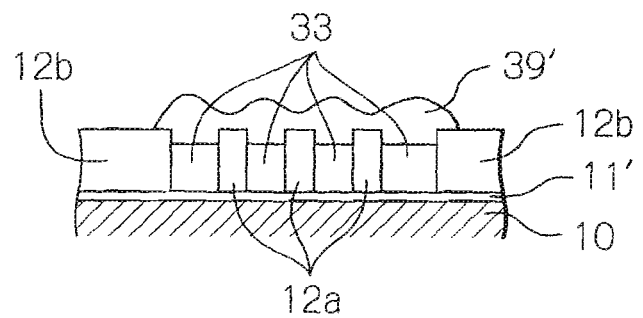
Figure 4E:
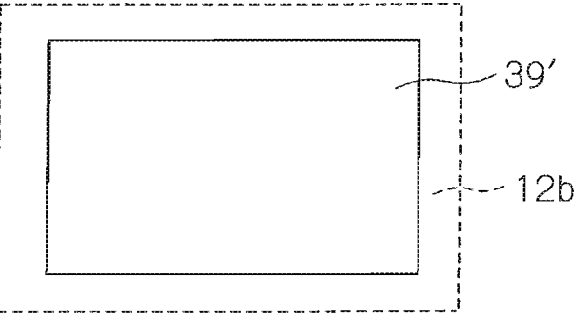

Then, a second metal layer or sacrifice layer 39' shown in FIGS. 3c and 4e is formed by performing a flame plating using the same electrode film 11' used in the flame plating of the first metal layer 33 and the resist pattern layer 12. This frame plating is performed so that Cu or other metal material for example is plated using a copper sulfate plating-bath for example. Also, this plating is performed so that the first metal layer 33 and the trench forming portion 12a' of the resist pattern layer are completely covered by the second metal layer 39'. It is necessary to select for the second metal layer 39' a metal material with a higher chemical activity or a higher ionization tendency than that of the first metal layer 33. This is because to prevent the first metal layer 33 from dissolving when the second metal layer 39' is dissolved and removed by a wet etching.

Figure 4F:
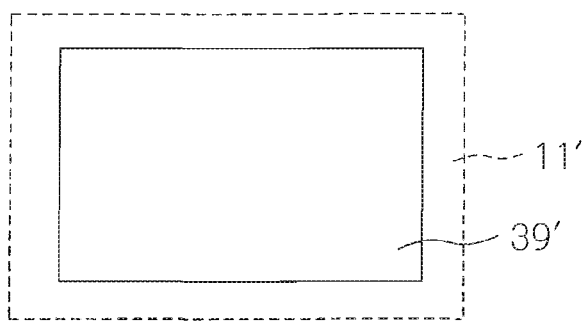

Then, as shown in FIG. 4f, the outer frame portion 12b of the resist pattern 12, which is uncovered by the second metal layer 39' is removed. This removal may be performed by immersing the substrate into an organic solution such as for example IPL or NMP and by rocking the immersed substrate.

Figure 3D:
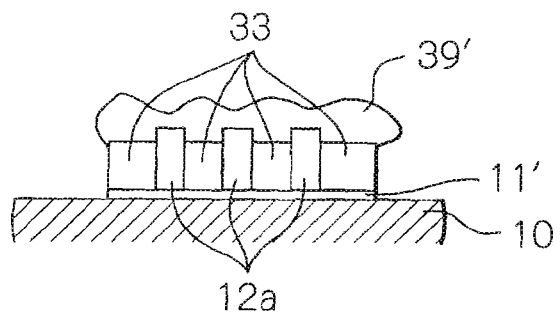
Figure 4G:
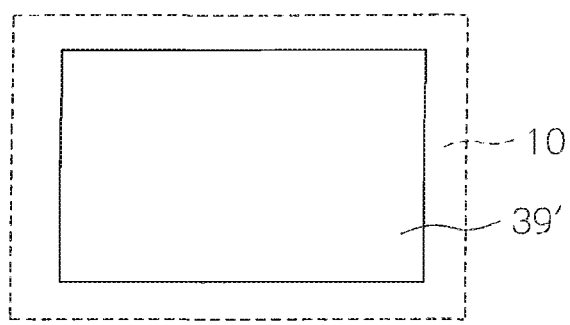

Then, as shown in FIGS. 3d and 4g, an area of the electrode film 11', which is uncovered by the second metal layer 39' is removed by ion milling to partially remain the electrode film 11 only under the first metal layer 33 and the second metal layer 39'. In this embodiment, the ion milling may be performed using a milling device such as for example IML of Hitachi, Ltd. Ar gas may be used as for the milling gas and a milling current of 300 mA may be used. Instead of ion milling, an RIE or a wet etching may be performed.

Figure 3E:
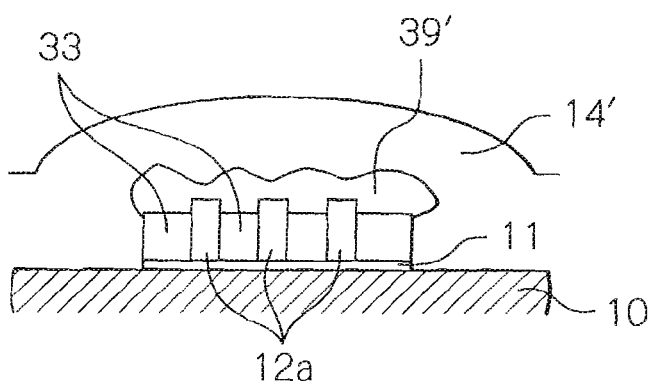
Figure 4H:
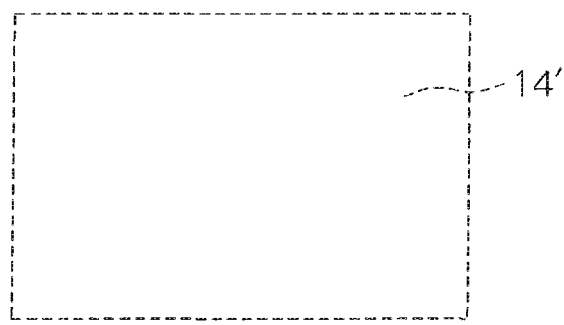

Then, as shown in FIGS. 3e and 4h, an insulation layer 14' is deposited as for a peripheral area layer, over the second metal layer 39'. The insulation layer 14' may be formed by performing sputtering of an insulation material such as for example $Al_2O_3$ to have a thickness of about 25 μm. In this embodiment, the sputtering may be performed using a bias-sputtering device of for example Hitachi, Ltd. A target of $Al_2O_3$ may be used and Ar gas may be used as for the sputtering gas.

Figure 3F:
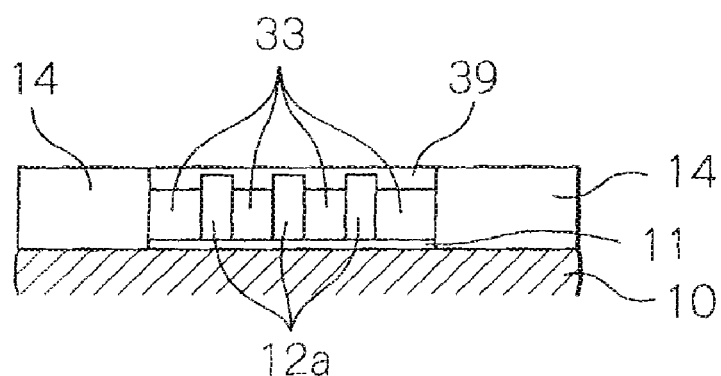
Figure 4I:
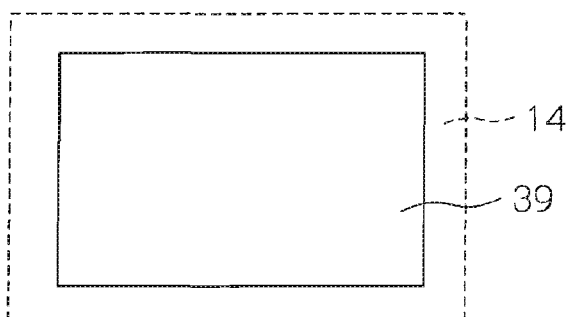

Thereafter, surfaces of the deposited insulation layer 14' and of the second metal layer 39' are planarized together by performing a CMP. In this embodiment, the CMP may be performed using a CMP device such as for example MIRRA of Applied Materials Inc. In the CMP process, a urethane pad is used with aluminum slurry having a grain diameter of 250 nm. This planarization process will be finished just before the trench forming portion 12a' of the resist pattern layer is exposed. As a result, as shown in FIGS. 3f and 4i, an insulation layer 14 and a second metal layer 39, with top surfaces planarized flat together in the same plane.

Figure 3G:
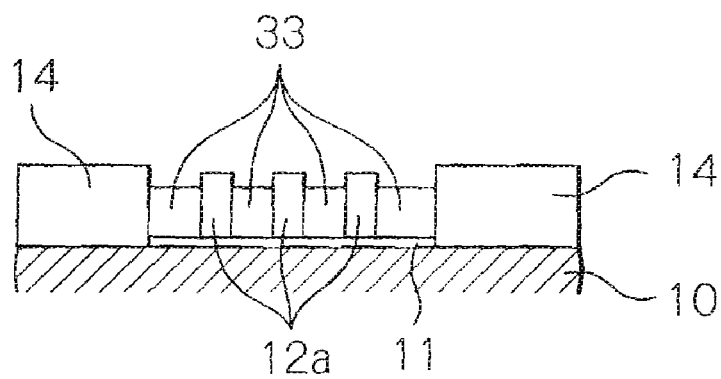
Figure 4J:
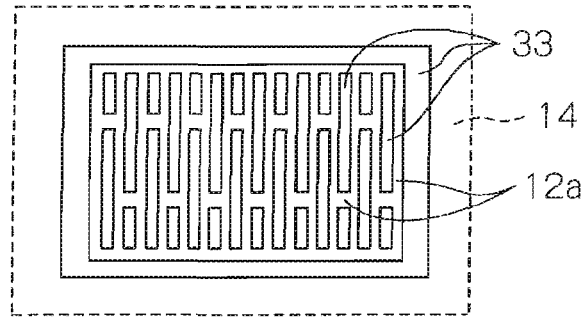

Then, as shown in FIGS. 3g and 4j, only the second metal layer 39 is dissolved and removed by a wet etching. This removal process may be performed by using an etching solution of aqueous ammonia and an ammonium persulfate so that the first metal layer 33 is not dissolved.

Figure 3H:
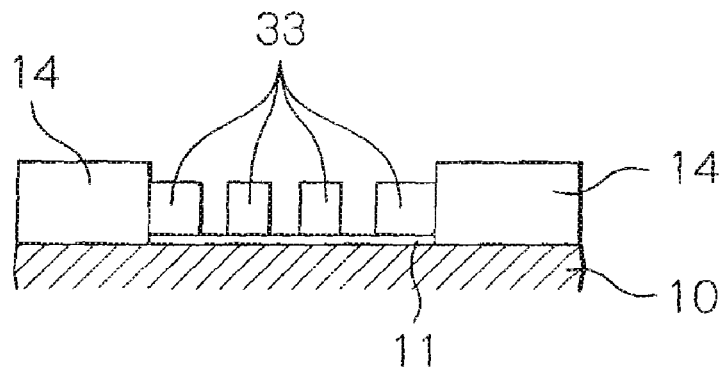
Figure 4K:
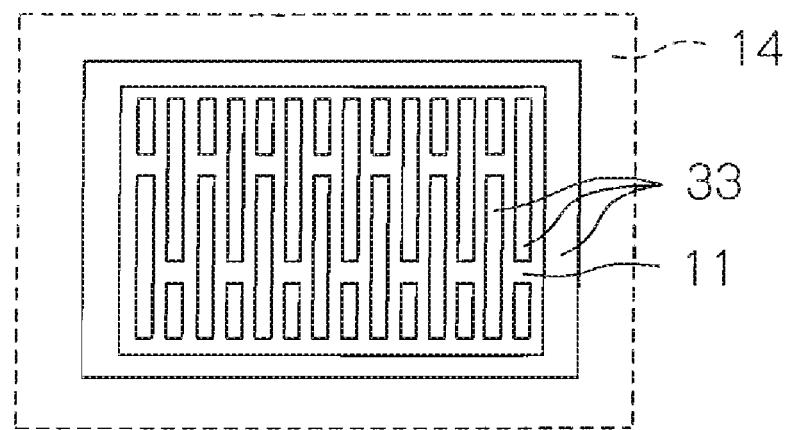

Then, as shown in FIGS. 3h and 4k, the trench forming portion 12a of the resist pattern is removed. This removal may be performed by immersing the substrate into an organic solution such as for example IPL or NMP and by rocking the immersed substrate.

According to the above-mentioned processes, the first metal layer 33 having a trench pattern of a plurality of convex portions or pillars arranged to sandwich concave portions or recesses with a depth of about 20 μm, surrounded by the insulation layer 14 that is a peripheral area layer, can be obtained. The convex portions or pillars of the first metal layer 33 are electrically conducted with each other through the electrode film 11. Particularly, in this embodiment, since the concave portions or recesses are filled with the second metal layer and the resist layer until the CMP planarization is finished, it is possible to prevent slurry used in CMP or lapped material from entering into the concave portions or recesses of the trench pattern and also to securely support the convex portions or pillars that configure the trench pattern by sandwiching the concave portions or recesses there between so as to effectively prevent these convex portions or pillars from being deformed or toppled over. According to this embodiment, however, the top surfaces of the first metal layer 33 and the insulation layer 14 that is the peripheral area layer are uneven as shown FIG. 3h.

Figure 3I:
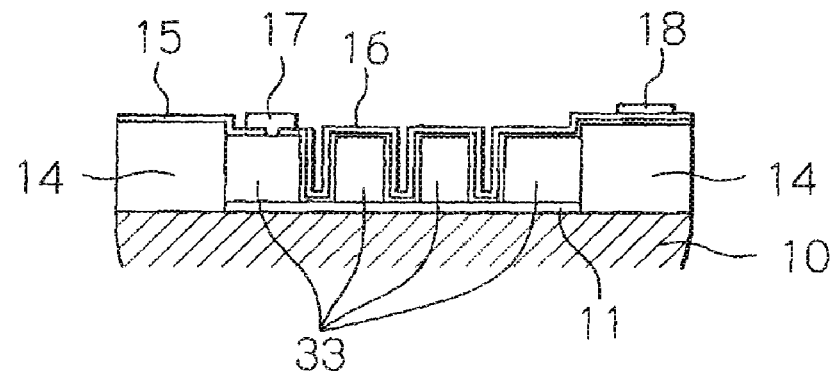
Figure 4L:
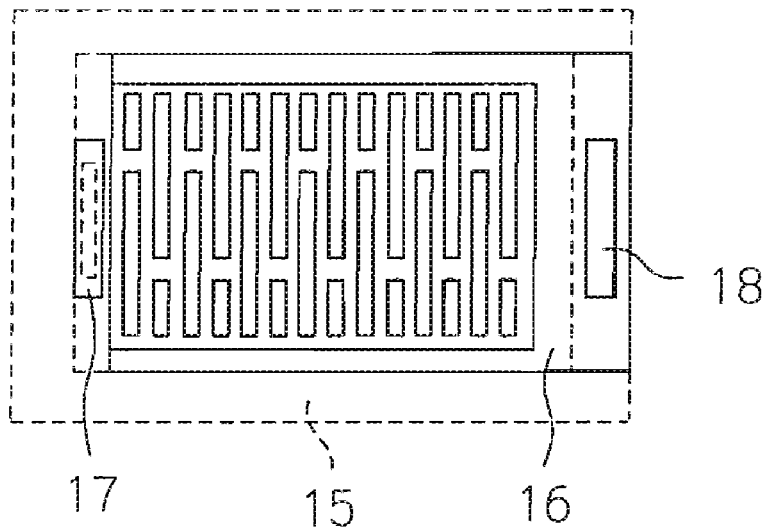

After forming such trench pattern, in this embodiment, a dielectric film 15 is formed on the top surfaces of the first metal layer 33 and the insulation layer 14 by depositing thereon, by sputtering, a dielectric material such as for example $Al_2O_3$ to have a thickness of about 80 nm. Then, an upper electrode film 16 is formed by depositing thereon, by sputtering, two conductive materials such as for example Cr and Cu to have a thickness of about 10 nm and a thickness of about 500 nm, respectively. Thereafter, electrode pads 17 and 18 that are electrically connected to the first metal layer 33 constituting a lower electrode and to the upper electrode film 16, respectively, are formed. As a result, as shown in FIGS. 3i and 4l, a trench capacitor is fabricated.

As described in detail, according to this embodiment, because the trench pattern is formed in a correct shape without deformation, a trench capacitor with high accuracy and high quality can be provided.

FIGS. 5a to 5i and FIGS. 6a to 6l schematically illustrate a part of processes in a third embodiment of a method of forming a metal trench pattern according to the present invention. In FIGS. 5a to 5i, the structure of a trench-forming portion of a resist pattern layer is simplified for the sake of clarity. In this embodiment, the similar components as these in the first embodiment are represented with the same reference numerals.

Hereinafter, in reference to these figures, a manufacturing process in this third embodiment will be described. Although a trench capacitor is fabricated as a thin-film device in this embodiment, the trench pattern forming method of this second embodiment can be utilized for fabricating another thin-film device such as MEMS for example.

Figure 6A:
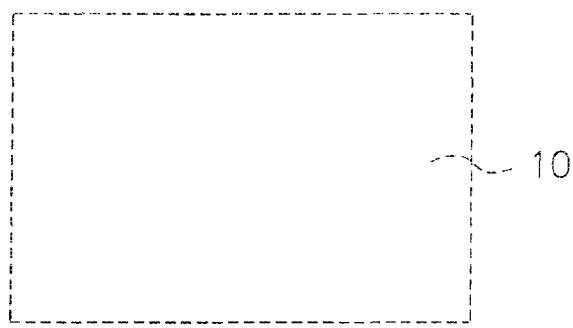
FIGS. 6a to 6l show plane views schematically illustrating a part of processes in the third embodiment shown in FIGS. 5a to 5i.

First, as shown in FIG. 6a, a substrate 10 is provided. As for the substrate 10, used is an $Al_2O_3$ substrate with a diameter of 6 inches and a thickness of 2 mm in this embodiment.

Figure 6B:
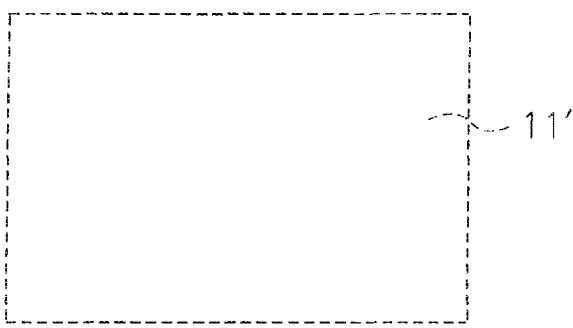

Then, as shown in FIG. 6b, an electrode film 11' that is a seed film for plating is deposited on the whole area of the substrate 10 or on a base layer formed on the substrate 10. The deposition of the electrode film 11' will be performed by sputtering or by vapor deposition of a metal material with a good conductivity such as Ni or else to have a thickness of about 100 nm.

Figure 5A:
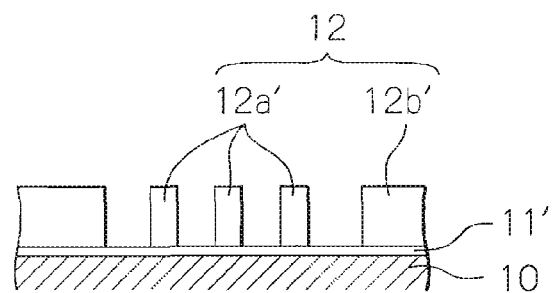
FIGS. 5a to 5i show sectional views schematically illustrating a part of processes in a third embodiment of a method of forming a metal trench pattern according to the present invention.
Figure 6C:
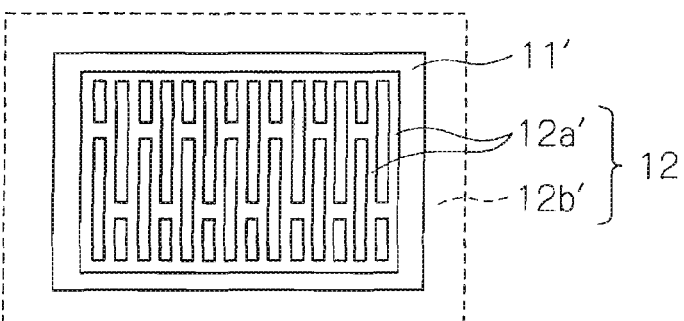

Then, as shown in FIGS. 5a and 6c, a resist pattern layer 12 is formed. This resist pattern layer 12 is constituted by a trench forming portion 12a' having a predetermined trench pattern and an outer frame portion 12b'.

The resist pattern layer 12 will be formed as follows. First, a resist film having a thickness of about 21 μm is formed by performing spin-coat of a liquid resist material such as for example SIPR-7100 of Shin-Etsu Chemical Co., Ltd. Thereafter, the formed resist film is pre-baked, exposed and then developed with the following conditions. The pre-baking is 100° C.×60 seconds. As for a pattern exposure machine, for example NSR-i12TFH ($\lambda$=365 nm, NA=0.3, $\sigma$=0.3) of Nikon Corporation is used. Exposure amount is 350 mJ/cm$^2$. PEB is 130° C.×360 seconds. As for a developer, an aqueous solution of 2.38% TMAH is used. The development is performed for 60 seconds×5 times. The shape of thus obtained resist pattern layer 12, particularly that of the trench forming portion 12a, is line and space (L/S) with a width of 5 μm. The outer frame portion 12b' is formed around outer circumference of the trench forming portion 12a'.

Figure 5B:
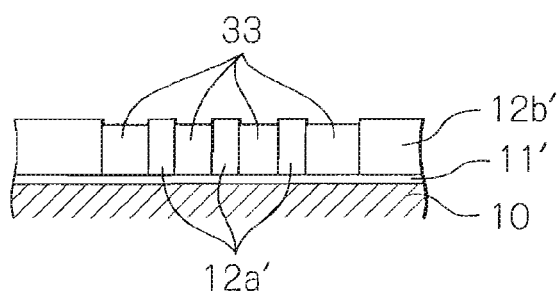
Figure 6D:
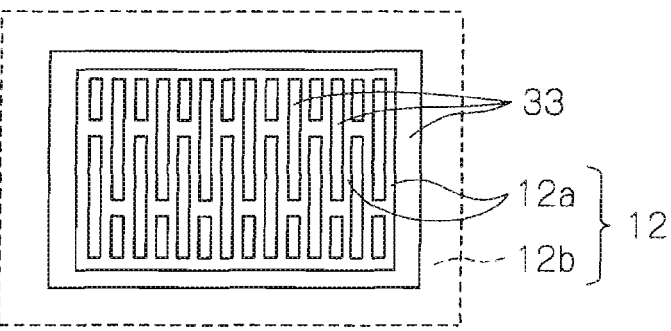

Then, a first metal layer 33 with the trench pattern shown in FIGS. 5b and 6d is formed by performing a flame plating using this resist pattern layer 12 and the electrode film 11'. This frame plating is performed so that Ni or other metal material for example is plated using a Watt bath for example to have a thickness of about 20 μm, and that spaces in the trench forming portion 12a' of the resist pattern layer 12 are partially filled with the first metal layer 33 but top surfaces of the first metal layer 33 are lower than a top of the trench forming portion 12a', in other words, the top end of the trench forming portion 12a' is exposed.

Figure 5C:
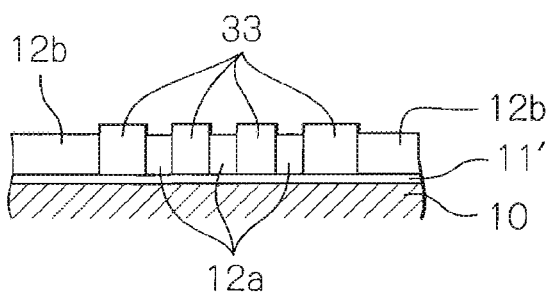

Then, as shown in FIG. 5c, a trench forming portion 12a and an outer frame portion 12b are obtained by performing an ashing process to reduce the thickness of the resist pattern layer 12 such that a top surface of the resist pattern layer 12 becomes lower than the top surfaces of the first metal layer 33. This ashing process is executed using for example an ashing device such as MAS of Alcantech Co., Inc. Oxygen ($O_2$) gas may be used as for the ashing gas.

Figure 5D:
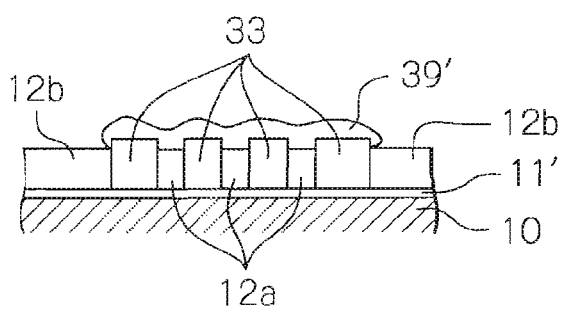
Figure 6E:
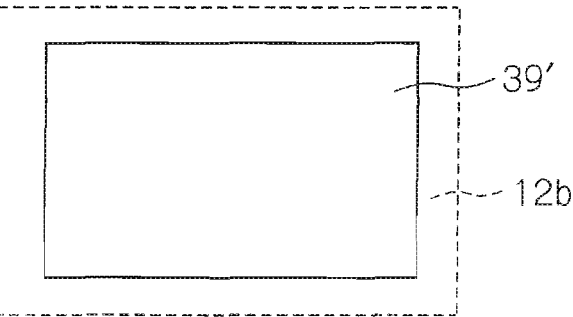

Then, a second metal layer or sacrifice layer 39' shown in FIGS. 5d and 6e is formed by performing a flame plating using the same electrode film 11' used in the flame plating of the first metal layer 33 and the resist pattern layer 12. This frame plating is performed so that Cu or other metal material for example is plated using a copper sulfate plating-bath for example. Also, this plating is performed so that the first metal layer 33 and the trench forming portion 12a of the resist pattern layer are completely covered by the second metal layer 39'. It is necessary to select for the second metal layer 39' a metal material with a higher chemical activity or a higher ionization tendency than that of the first metal layer 33. This is because to prevent the first metal layer 33 from dissolving when the second metal layer 39' is dissolved and removed by a wet etching.

Figure 6F:
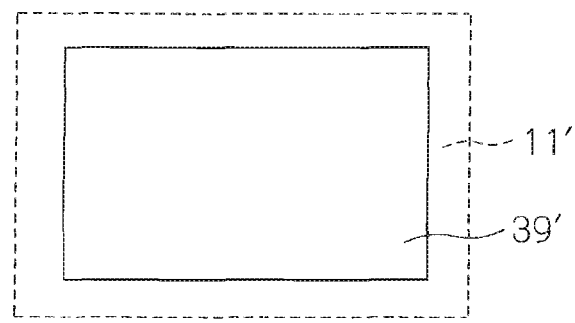

Then, as shown in FIG. 6f, the outer frame portion 12b' of the resist pattern 12, which is uncovered by the second metal layer 39' is removed. This removal may be performed by immersing the substrate into an organic solution such as for example IPL or NMP and by rocking the immersed substrate.

Figure 5E:
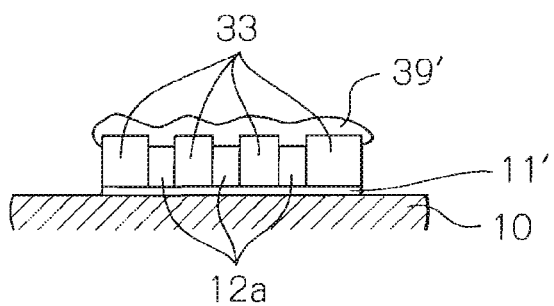
Figure 6G:
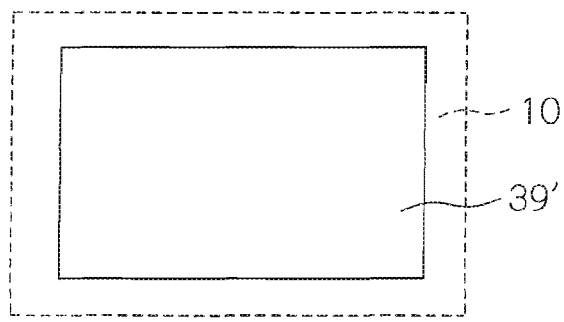

Then, as shown in FIGS. 5e and 6g, an area of the electrode film 11', which is uncovered by the second metal layer 39' is removed by ion milling to partially remain the electrode film 11 only under the first metal layer 33 and the second metal layer 39'. In this embodiment, the ion milling may be performed using a milling device such as for example IML of Hitachi, Ltd. Ar gas may be used as for the milling gas and a milling current of 300 mA may be used. Instead of ion milling, an RIE or a wet etching may be performed.

Figure 5F:
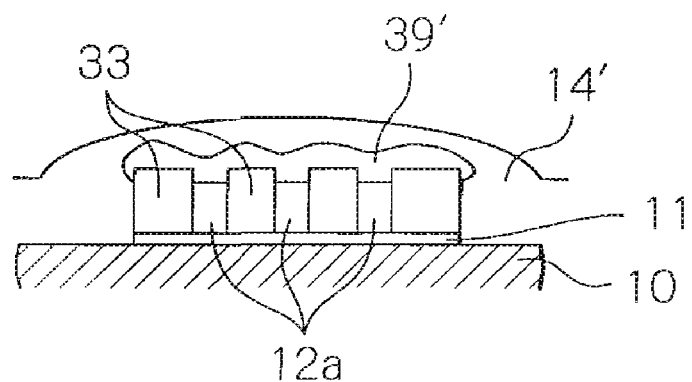
Figure 6H:
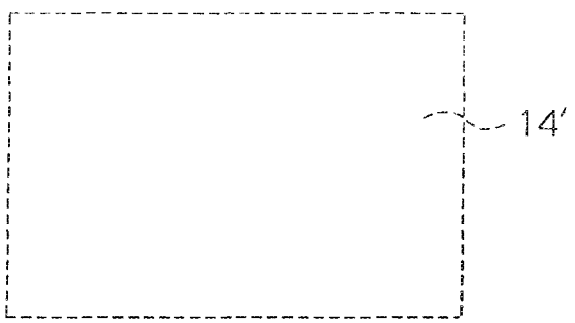

Then, as shown in FIGS. 5f and 6h, an insulation layer 14' is deposited as for a peripheral area layer, over the second metal layer 39'. The insulation layer 14' may be formed by performing sputtering of an insulation material such as for example $Al_2O_3$ to have a thickness of about 25 μm. In this embodiment, the sputtering may be performed using a bias-sputtering device of for example Hitachi, Ltd. A target of $Al_2O_3$ may be used and Ar gas may be used as for the sputtering gas.

Figure 5G:
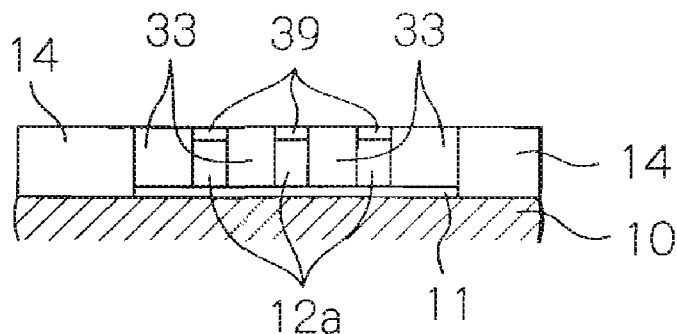
Figure 6I:
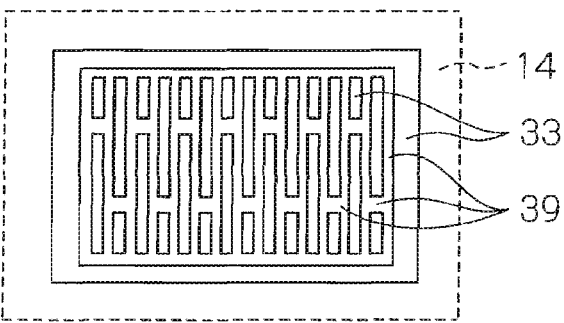

Thereafter, surfaces of the deposited insulation layer 14' and of the second metal layer 39' are planarized together by performing a CMP. In this embodiment, the CMP may be performed using a CMP device such as for example MIRRA of Applied Materials Inc. In the CMP process, a urethane pad is used with aluminum slurry having a grain diameter of 250 nm. This planarization process will be continued until the first metal layer 33 is exposed. As a result, as shown in FIGS. 5g and 6i, an insulation layer 14, a first metal layer 33 and a second metal layer 39, with top surfaces planarized flat together in the same plane.

Figure 6J:
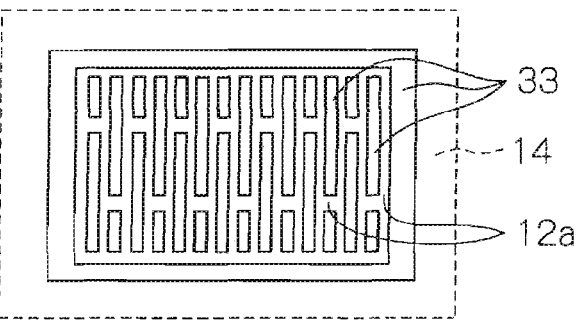
Figure 6K:
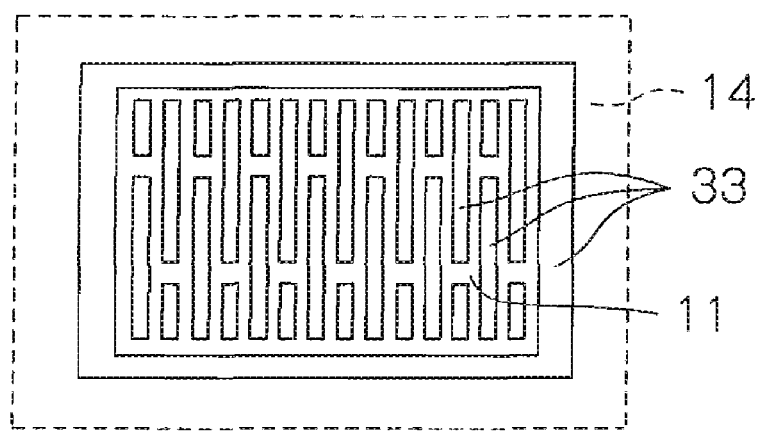

Then, as shown in FIG. 6j, only the second metal layer 39 is dissolved and removed by a wet etching. This removal process may be performed by using an etching solution of aqueous ammonia and an ammonium persulfate so that the first metal layer 33 is not dissolved.

Figure 5H:
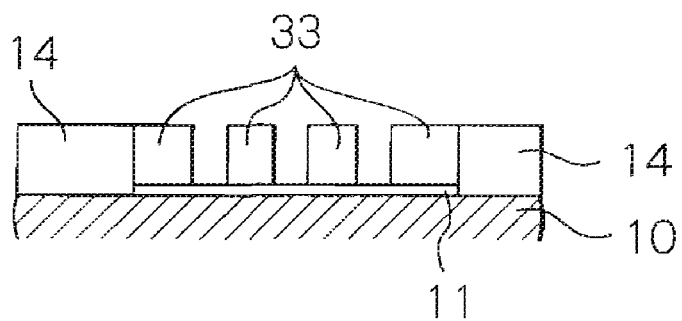

Then, as shown in FIGS. 5h and 5k, the trench forming portion 12a of the resist pattern is removed. This removal may be performed by immersing the substrate into an organic solution such as for example IPL or NMP and by rocking the immersed substrate.

According to the above-mentioned processes, the first metal layer 33 having a trench pattern of a plurality of convex portions or pillars arranged to sandwich concave portions or recesses with a depth of about 20 μm, surrounded by the insulation layer 14 that is a peripheral area layer, can be obtained. The convex portions or pillars of the first metal layer 33 are electrically conducted with each other through the electrode film 11. Particularly, in this embodiment, since the concave portions or recesses are filled with the second metal layer and the resist layer until the CMP planarization is finished, it is possible to prevent slurry used in CMP or lapped material from entering into the concave portions or recesses of the trench pattern and also to securely support the convex portions or pillars that configure the trench pattern by sandwiching the concave portions or recesses there between so as to effectively prevent these convex portions or pillars from being deformed or toppled over. According to this embodiment, the top surfaces of the first metal layer 33 and the insulation layer 14 that is the peripheral area layer are even as shown FIG. 5h.

Figure 5I:
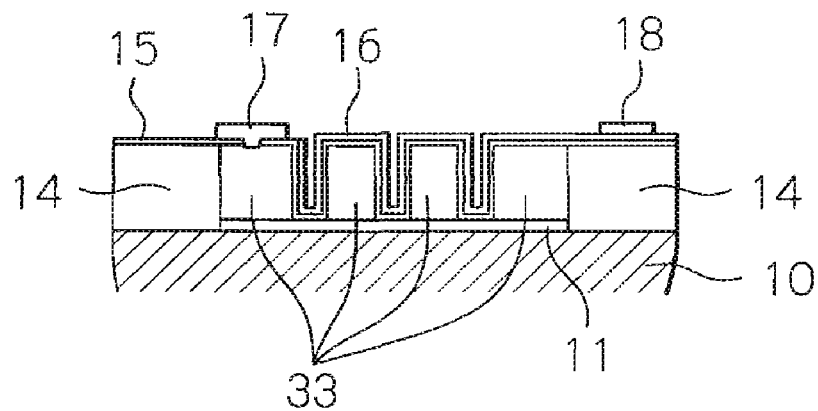
Figure 6L:
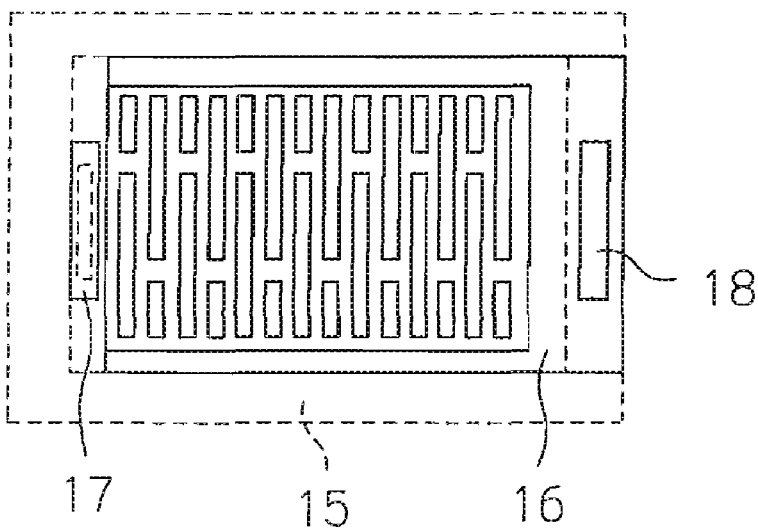

After forming such trench pattern, in this embodiment, a dielectric film 15 is formed on the top surfaces of the first metal layer 33 and the insulation layer 14 by depositing thereon, by sputtering, a dielectric material such as for example $Al_2O_3$ to have a thickness of about 80 nm. Then, an upper electrode film 16 is formed by depositing thereon, by sputtering, two conductive materials such as for example Cr and Cu to have a thickness of about 10 nm and a thickness of about 500 nm, respectively. Thereafter, electrode pads 17 and 18 that are electrically connected to the first metal layer 33 constituting a lower electrode and to the upper electrode film 16, respectively, are formed. As a result, as shown in FIGS. 5i and 6l, a trench capacitor is fabricated.

As described in detail, according to this embodiment, because the trench pattern is formed in a correct shape without deformation, a trench capacitor with high accuracy and high quality can be provided.

FIGS. 7a to 7g and FIGS. 8a to 8i schematically illustrate a part of processes in a fourth embodiment of a method of forming a metal trench pattern according to the present invention. In FIGS. 7a to 7g, the structure of a trench-forming portion of a resist pattern layer is simplified for the sake of clarity. In this embodiment, the similar components as these in the first embodiment are represented with the same reference numerals.

Hereinafter, in reference to these figures, a manufacturing process in this fourth embodiment will be described. Although a trench capacitor is fabricated as a thin-film device in this embodiment, the trench pattern forming method of this second embodiment can be utilized for fabricating another thin-film device such as MEMS for example.

Figure 8A:
FIGS. 8a to 8i show plane views schematically illustrating a part of processes in the fourth embodiment shown in FIGS. 7a to 7g.

First, as shown in FIG. 8a, a substrate 10 is provided. As for the substrate 10, used is an $Al_2O_3$ substrate with a diameter of 6 inches and a thickness of 2 mm in this embodiment.

Figure 8B:

Then, as shown in FIG. 8b, an electrode film 11 that is a seed film for plating is deposited on the whole area of the substrate 10 or on a base layer formed on the substrate 10. The deposition of the electrode film 11 will be performed by sputtering or by vapor deposition of a metal material with a good conductivity such as Ni or else to have a thickness of about 100 nm.

Figure 7A:
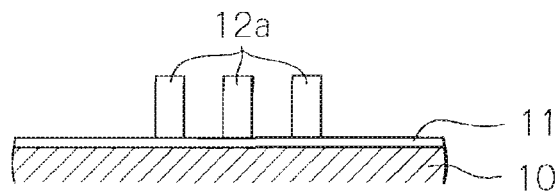
FIGS. 7a to 7g show sectional views schematically illustrating a part of processes in a fourth embodiment of a method of forming a metal trench pattern according to the present invention.
Figure 8C:
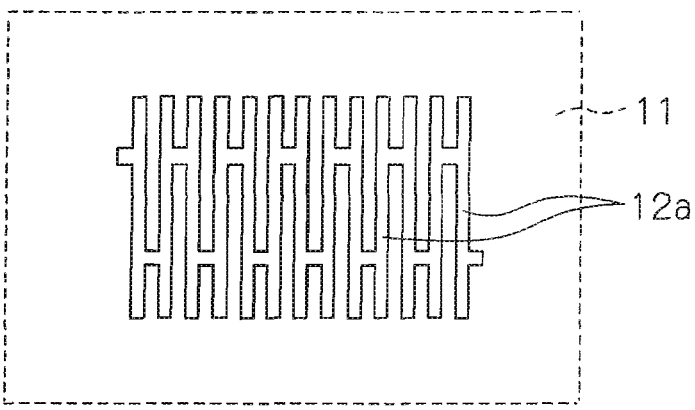

Then, as shown in FIGS. 7a and 8c, a resist pattern layer 12 is formed. This resist pattern layer 12 is constituted by only a trench forming portion 12a having a predetermined trench pattern.

The resist pattern layer 12 will be formed as follows. First, a resist film having a thickness of about 21 μm is formed by performing spin-coat of a liquid resist material such as for example SIPR-7100 of Shin-Etsu Chemical Co., Ltd. Thereafter, the formed resist film is pre-baked, exposed and then developed with the following conditions. The pre-baking is 100° C.×60 seconds. As for a pattern exposure machine, for example NSR-i12TFH ($\lambda$=365 nm, NA=0.3, $\sigma$=0.3) of Nikon Corporation is used. Exposure amount is 350 mJ/cm$^2$. PEB is 130° C.×360 seconds. As for a developer, an aqueous solution of 2.38% TMAH is used. The development is performed for 60 seconds×5 times. The shape of thus obtained trench forming portion 12a of the resist pattern layer 12 is line and space (L/S) with a width of 5 μm.

Figure 7B:
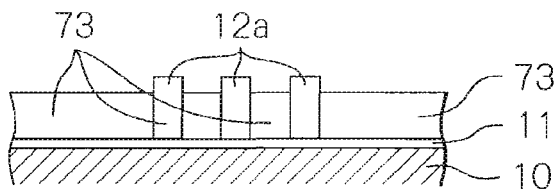
Figure 8D:
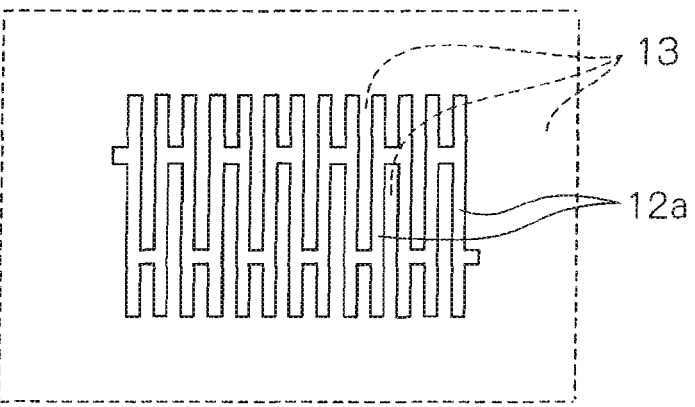

Then, a first metal layer 73 having the trench pattern shown in FIGS. 7b and 8d and extending to its peripheral area is formed by performing a flame plating using this resist pattern layer 12 and the electrode film 11. This frame plating is performed so that Ni or other metal material for example is plated using a Watt bath for example to have a thickness of about 20 μm, and that spaces in the trench forming portion 12a of the resist pattern layer 12 are partially filled with the first metal layer 73 but top surfaces of the first metal layer 73 are lower than a top of the trench forming portion 12a, in other words, the top end of the trench forming portion 12a is exposed.

Figure 7C:
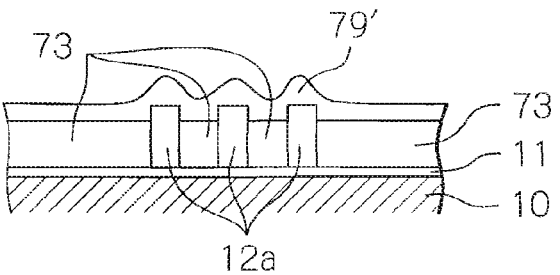
Figure 8E:

Then, a second metal layer or sacrifice layer 79' shown in FIGS. 7c and 8e is formed by performing a flame plating using the same electrode film 11' used in the flame plating of the first metal layer 73 and the resist pattern layer 12. This frame plating is performed so that Cu or other metal material for example is plated using a copper sulfate plating-bath for example. Also, this plating is performed so that the first metal layer 73 and the trench forming portion 12a of the resist pattern layer are completely covered by the second metal layer 79'. It is necessary to select for the second metal layer 79' a metal material with a higher chemical activity or a higher ionization tendency than that of the first metal layer 73. This is because to prevent the first metal layer 73 from dissolving when the second metal layer 79' is dissolved and removed by a wet etching.

Figure 7D:
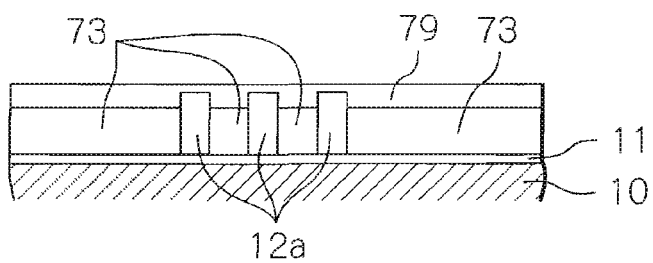
Figure 8F:

Then, a surface of the second metal layer 79' is planarized by performing a CMP. In this embodiment, the CMP may be performed using a CMP device such as for example MIRRA of Applied Materials Inc. In the CMP process, a urethane pad is used with aluminum slurry having a grain diameter of 250 nm. This planarization process will be finished just before the trench forming portion 12a of the resist pattern layer is exposed. As a result, as shown in FIGS. 7d and 8f, a second metal layer 79, with a flat top surface.

Figure 7E:
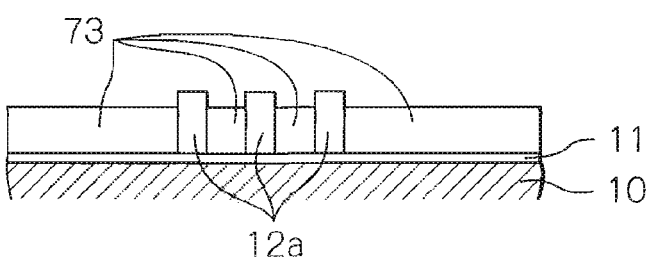
Figure 8G:
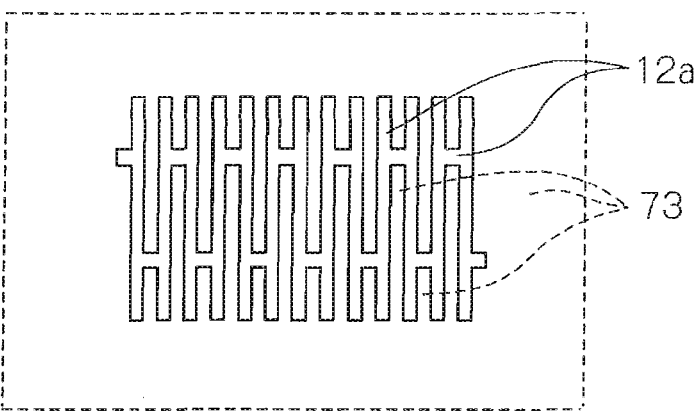

Then, as shown in FIGS. 7e and 8g, only the second metal layer 79 is dissolved and removed by a wet etching. This removal process may be performed by using an etching solution of aqueous ammonia and an ammonium persulfate so that the first metal layer 73 is not dissolved.

Figure 7F:
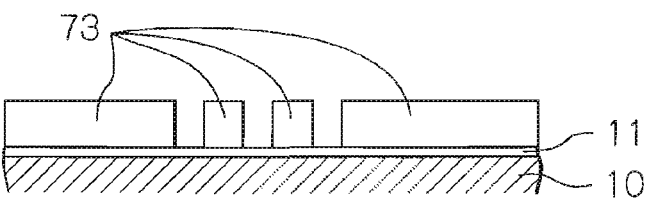
Figure 8H:
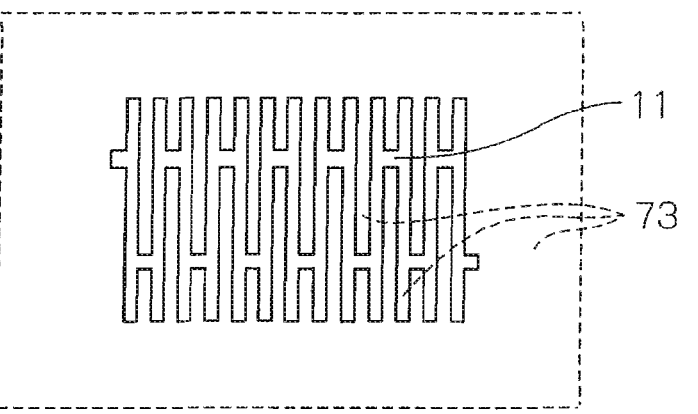

Then, as shown in FIGS. 7f and 8h, the trench forming portion 12a of the resist pattern is removed. This removal may be performed by immersing the substrate into an organic solution such as for example IPL or NMP and by rocking the immersed substrate.

According to the above-mentioned processes, the first metal layer 73 having a trench pattern of a plurality of convex portions or pillars arranged to sandwich concave portions or recesses with a depth of about 20 μm, surrounded by its peripheral area part, can be obtained. The convex portions or pillars of the first metal layer 73 are electrically conducted with each other through the electrode film 11. Particularly, in this embodiment, since the concave portions or recesses are filled with the resist pattern layer until the CMP planarization is finished, it is possible to prevent slurry used in CMP or lapped material from entering into the concave portions or recesses of the trench pattern. Also, since the second metal layer is formed on the resist pattern layer and the first metal layer, it is possible to securely support the convex portions or pillars that configure the trench pattern by sandwiching the concave portions or recesses there between so as to effectively prevent these convex portions or pillars from being deformed or toppled over. According to this embodiment, the top surfaces of the convex portions or pillars and the peripheral area part of the first metal layer 73 are even as shown FIG. 7f.

Figure 7G:
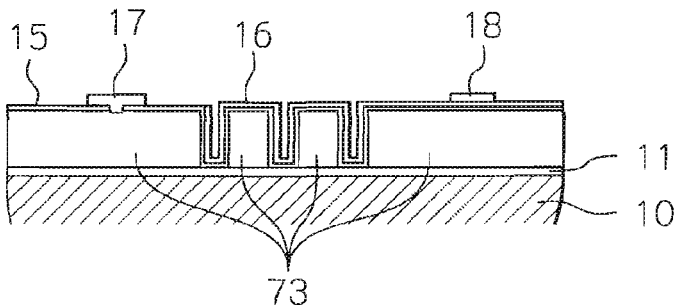
Figure 8I:
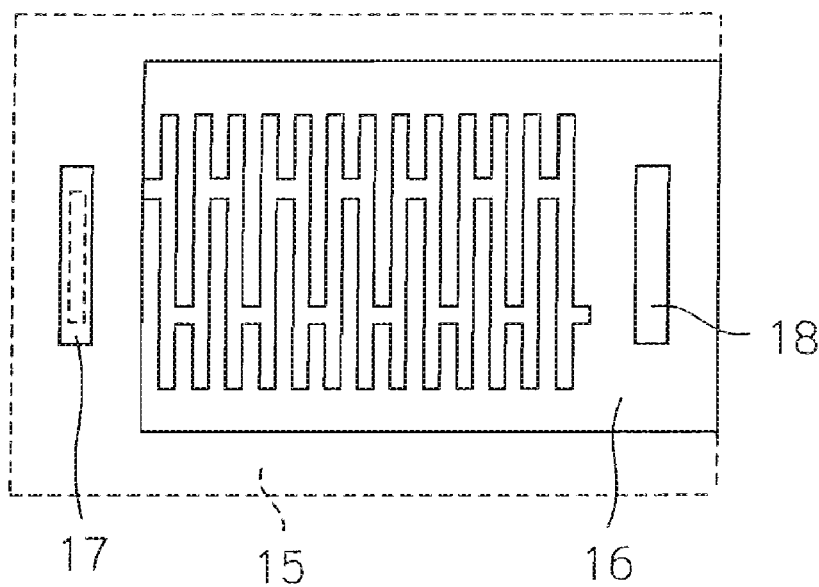

After forming such trench pattern, in this embodiment, a dielectric film 15 is formed on the top surface of the first metal layer 73 by depositing thereon, by sputtering, a dielectric material such as for example $Al_2O_3$ to have a thickness of about 80 nm. Then, an upper electrode film 16 is formed by depositing thereon, by sputtering, two conductive materials such as for example Cr and Cu to have a thickness of about 10 nm and a thickness of about 500 nm, respectively. Thereafter, electrode pads 17 and 18 that are electrically connected to the first metal layer 73 constituting a lower electrode and to the upper electrode film 16, respectively, are formed. As a result, as shown in FIGS. 7g and 8i, a trench capacitor is fabricated.

As described in detail, according to this embodiment, because the trench pattern is formed in a correct shape without deformation, a trench capacitor with high accuracy and high quality can be provided.

FIGS. 9a to 9g and FIGS. 10a to 10i schematically illustrate a part of processes in a fifth embodiment of a method of forming a metal trench pattern according to the present invention. In FIGS. 9a to 9g, the structure of a trench-forming portion of a resist pattern layer is simplified for the sake of clarity. In this embodiment, the similar components as these in the first embodiment are represented with the same reference numerals.

Hereinafter, in reference to these figures, a manufacturing process in this fifth embodiment will be described. Although a trench capacitor is fabricated as a thin-film device in this embodiment, the trench pattern forming method of this second embodiment can be utilized for fabricating another thin-film device such as MEMS for example.

Figure 10A:
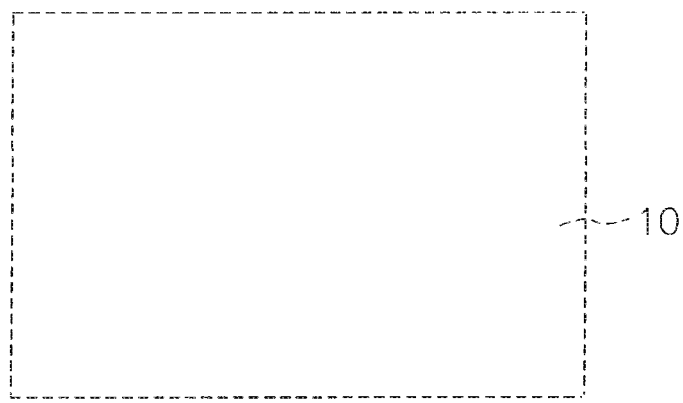
FIGS. 10a to 10i show plane views schematically illustrating a part of processes in the fifth embodiment-shown in FIGS. 9a to 9g.

First, as shown in FIG. 10a, a substrate 10 is provided. As for the substrate 10, used is an $Al_2O_3$ substrate with a diameter of 6 inches and a thickness of 2 mm in this embodiment.

Figure 10B:

Then, as shown in FIG. 10b, an electrode film 11 that is a seed film for plating is deposited on the whole area of the substrate 10 or on a base layer formed on the substrate 10. The deposition of the electrode film 11 will be performed by sputtering or by vapor deposition of a metal material with a good conductivity such as Ni or else to have a thickness of about 100 nm.

Figure 9A:
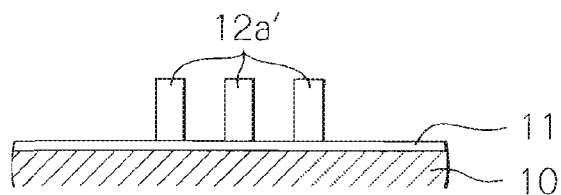
FIGS. 9a to 9g show sectional views schematically illustrating a part of processes in a fifth embodiment of a method of forming a metal trench pattern according to the present invention.
Figure 10C:
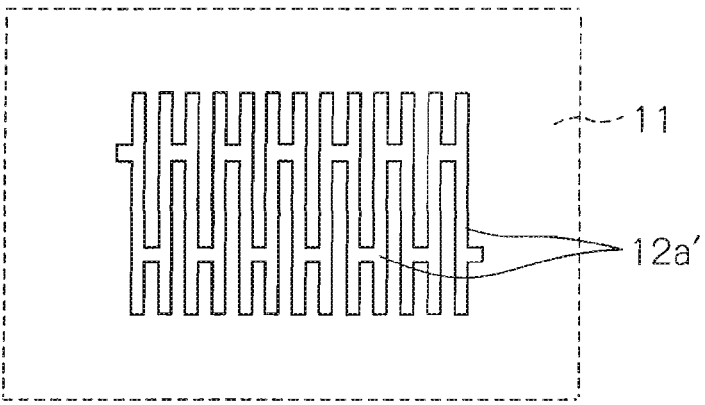

Then, as shown in FIGS. 9a and 10c, a resist pattern layer 12 is formed. This resist pattern layer 12 is constituted by only a trench forming portion 12a' having a predetermined trench pattern.

The resist pattern layer 12 will be formed as follows. First, a resist film having a thickness of about 21 μm is formed by performing spin-coat of a liquid resist material such as for example SIPR-7100 of Shin-Etsu Chemical Co., Ltd. Thereafter, the formed resist film is pre-baked, exposed and then developed with the following conditions. The pre-baking is 100° C.×60 seconds. As for a pattern exposure machine, for example NSR-i12TFH ($\lambda$=365 nm, NA=0.3, σ=0.3) of Nikon Corporation is used. Exposure amount is 350 mJ/cm². PEB is 130° C.×360 seconds. As for a developer, an aqueous solution of 2.38% TMAH is used. The development is performed for 60 seconds×5 times. The shape of thus obtained trench forming portion 12a' of the resist pattern layer 12 is line and space (L/S) with a width of 5 μm.

Figure 9B:
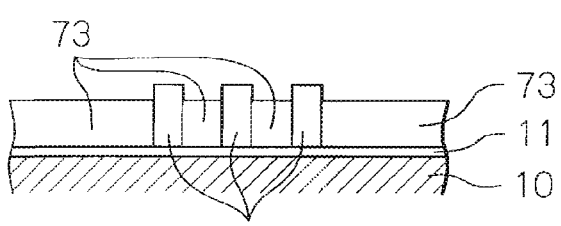
Figure 10D:
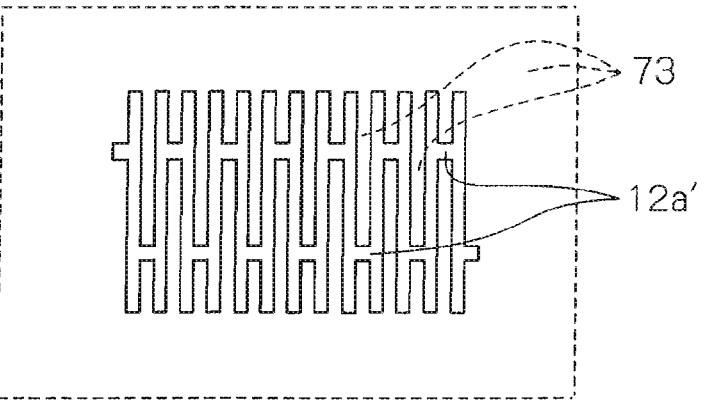

Then, a first metal layer 73 having the trench pattern shown in FIGS. 9b and 10d and extending to its peripheral area is formed by performing a flame plating using this resist pattern layer 12 and the electrode film 11. This frame plating is performed so that Ni or other metal material for example is plated using a Watt bath for example to have a thickness of about 20 μm, and that spaces in the trench forming portion 12a' of the resist pattern layer 12 are partially filled with the first metal layer 73 but top surfaces of the first metal layer 73 are lower than a top of the trench forming portion 12a', in other words, the top end of the trench forming portion 12a' is exposed.

Figure 9C:
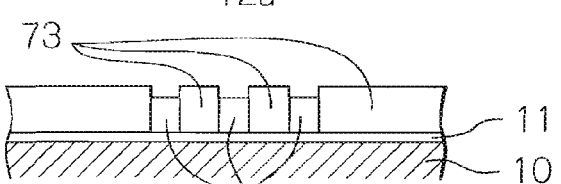
Figure 9D:
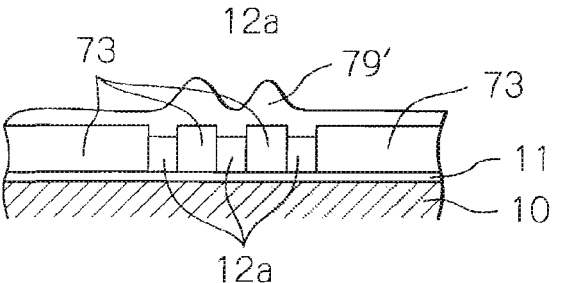

Then, as shown in FIG. 9c, a trench forming portion 12a is obtained by performing an ashing process to reduce the thickness of the resist pattern layer 12 such that a top surface of trench forming portion of the resist pattern layer 12 becomes lower than the top surfaces of the first metal layer 33. This ashing process is executed using for example an ashing device such as MAS of Alcantech Co., Inc. $O_2$ gas may be used as for the ashing gas.

Figure 10E:
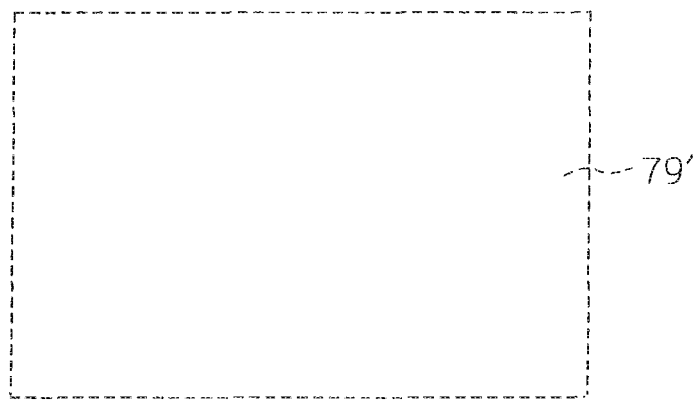

Then, a second metal layer or sacrifice layer 79' shown in FIGS. 9c and 10e is formed by performing a flame plating using the same electrode film 11 used in the flame plating of the first metal layer 73 and the resist pattern layer 12. This frame plating is performed so that Cu or other metal material for example is plated using a copper sulfate plating-bath for example. Also, this plating is performed so that the first metal layer 73 and the trench forming portion 12a of the resist pattern layer are completely covered by the second metal layer 79'. It is necessary to select for the second metal layer 79' a metal material with a higher chemical activity or a higher ionization tendency than that of the first metal layer 73. This is because to prevent the first metal layer 73 from dissolving when the second metal layer 79' is dissolved and removed by a wet etching.

Figure 9E:
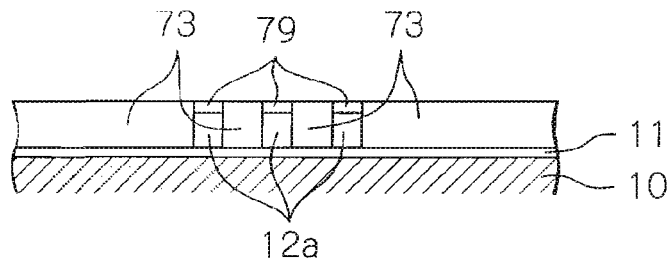
Figure 10F:
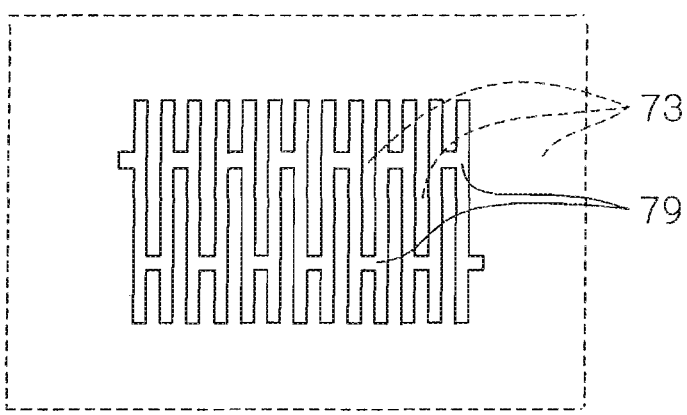

Then, a surface of the second metal layer 79' is planarized by performing a CMP. In this embodiment, the CMP may be performed using a CMP device such as for example MIRRA of Applied Materials Inc. In the CMP process, a urethane pad is used with aluminum slurry having a grain diameter of 250 nm. This planarization process will be continued until the first metal layer 73 is exposed. As a result, as shown in FIGS. 9e and 10f, a first metal layer 73 and a second metal layer 79, with top surfaces planarized flat together in the same plane.

Figure 10G:
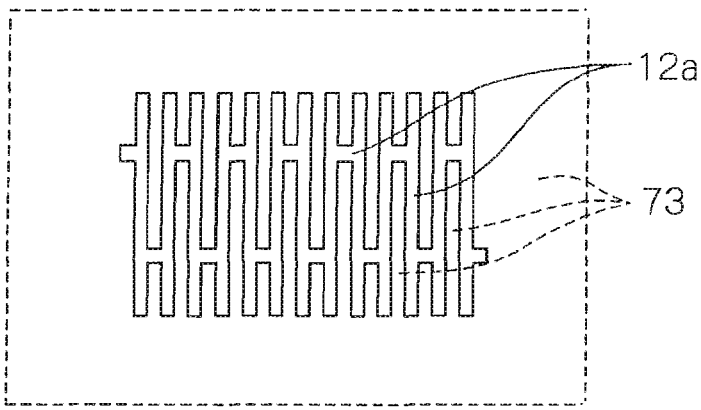

Then, as shown in FIG. 10g, only the second metal layer 79 is dissolved and removed by a wet etching. This removal process may be performed by using an etching solution of aqueous ammonia and an ammonium persulfate so that the first metal layer 73 is not dissolved.

Figure 9F:
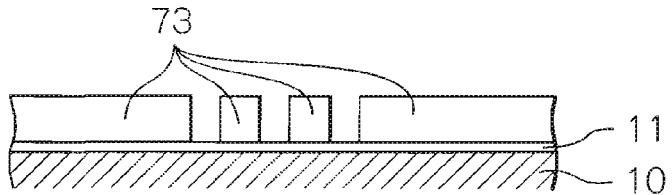
Figure 10H:
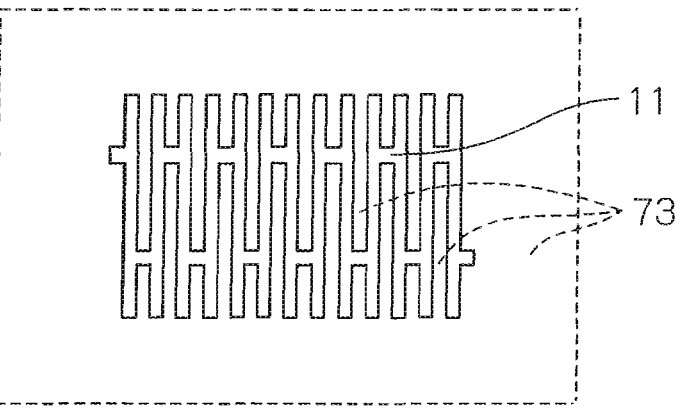

Then, as shown in FIGS. 9f and 10h, the trench forming portion 12a of the resist pattern is removed. This removal may be performed by immersing the substrate into an organic solution such as for example IPL or NMP and by rocking the immersed substrate.

According to the above-mentioned processes, the first metal layer 73 having a trench pattern of a plurality of convex portions or pillars arranged to sandwich concave portions or recesses with a depth of about 20 μm, surrounded by its peripheral area part, can be obtained. The convex portions or pillars of the first metal layer 73 are electrically conducted with each other through the electrode film 11. Particularly, in this embodiment, since the concave portions or recesses are filled with the second metal layer and the resist pattern layer until the CMP planarization is finished, it is possible to prevent slurry used in CMP or lapped material from entering into the concave portions or recesses of the trench pattern. Since not only the resist layer but also the second metal layer is filled in the concave portions or recesses, it is possible to securely support the convex portions or pillars that configure the trench pattern by sandwiching the concave portions or recesses there between so as to effectively prevent these convex portions or pillars from being deformed or toppled over. According to this embodiment, the top surfaces of the convex portions or pillars and the peripheral area part of the first metal layer 73 are even as shown FIG. 9f.

Figure 9G:
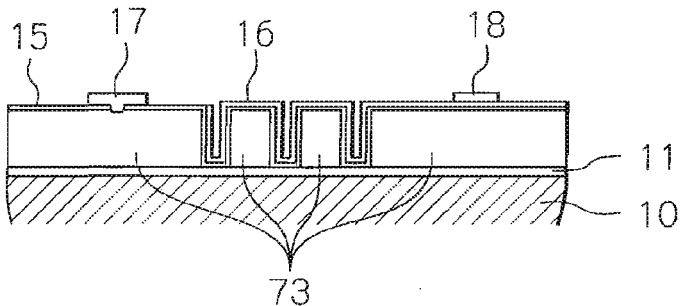
Figure 10I:
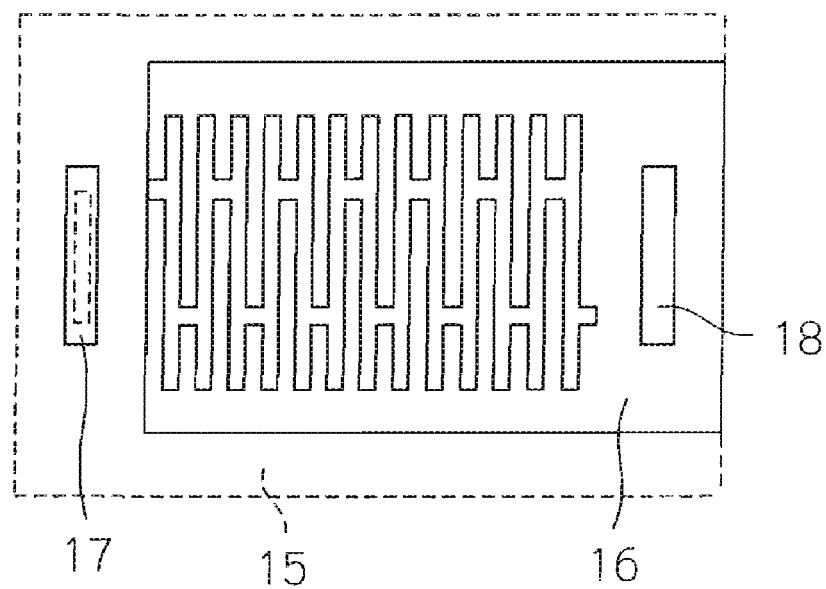

After forming such trench pattern, in this embodiment, a dielectric film 15 is formed on the top surface of the first metal layer 73 by depositing thereon, by sputtering, a dielectric material such as for example $Al_2O_3$ to have a thickness of about 80 nm. Then, an upper electrode film 16 is formed by depositing thereon, by sputtering, two conductive materials such as for example Cr and Cu to have a thickness of about 10 nm and a thickness of about 500 nm, respectively. Thereafter, electrode pads 17 and 18 that are electrically connected to the first metal layer 73 constituting a lower electrode and to the upper electrode film 16, respectively, are formed. As a result, as shown in FIGS. 9g and 10i, a trench capacitor is fabricated.

As described in detail, according to this embodiment, because the trench pattern is formed in a correct shape without deformation, a trench capacitor with high accuracy and high quality can be provided.

FIGS. 11a to 11e and FIGS. 12a to 12g schematically illustrate a part of processes in a sixth embodiment of a method of forming a metal trench pattern according to the present invention. In FIGS. 11a to 11e, the structure of a trench-forming portion of a resist pattern layer is simplified for the sake of clarity. In this embodiment, the similar components as these in the first embodiment are represented with the same reference numerals.

Hereinafter, in reference to these figures, a manufacturing process in this sixth embodiment will be described. Although a trench capacitor is fabricated as a thin-film device in this embodiment, the trench pattern forming method of this second embodiment can be utilized for fabricating another thin-film device such as MEMS for example.

Figure 12A:
FIGS. 12a to 12g show plane views schematically illustrating a part of processes in the sixth embodiment shown in FIGS. 11a to 11e.

First, as shown in FIG. 12a, a substrate 10 is provided. As for the substrate 10, used is an $Al_2O_3$ substrate with a diameter of 6 inches and a thickness of 2 mm in this embodiment.

Figure 12B:

Then, as shown in FIG. 12b, an electrode film 11 that is a seed film for plating is deposited on the whole area of the substrate 10 or on a base layer formed on the substrate 10. The deposition of the electrode film 11 will be performed by sputtering or by vapor deposition of a metal material with a good conductivity such as Ni or else to have a thickness of about 100 nm.

Figure 11A:
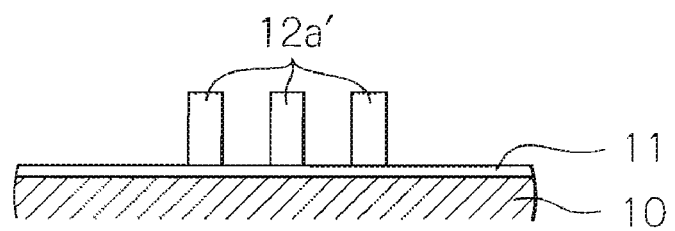
FIGS. 11a to 11e show sectional views schematically illustrating a part of processes in a sixth embodiment of a method of forming a metal trench pattern according to the present invention.
Figure 12C:
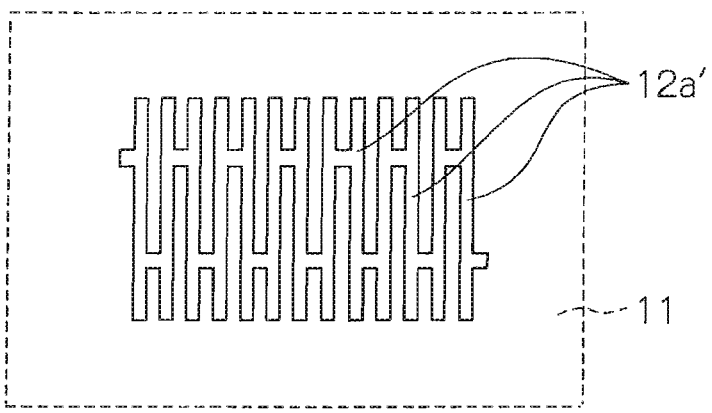

Then, as shown in FIGS. 11a and 12c, a resist pattern layer 12 is formed. This resist pattern layer 12 is constituted by only a trench forming portion 12a' having a predetermined trench pattern.

The resist pattern layer 12 will be formed as follows. First, a resist film having a thickness of about 21 μm is formed by performing spin-coat of a liquid resist material such as for example SIPR-7100 of Shin-Etsu Chemical Co., Ltd. Thereafter, the formed resist film is pre-baked, exposed and then developed with the following conditions. The pre-baking is 100° C.×60 seconds. As for a pattern exposure machine, for example NSR-i12TFH (λ=365 nm, NA=0.3, σ=0.3) of Nikon Corporation is used. Exposure amount is 350 mJ/cm². PEB is 130° C.×360 seconds. As for a developer, an aqueous solution of 2.38% TMAH is used. The development is performed for 60 seconds×5 times. The shape of thus obtained trench forming portion 12a' of the resist pattern layer 12 is line and space (L/S) with a width of 5 μm.

Figure 11B:
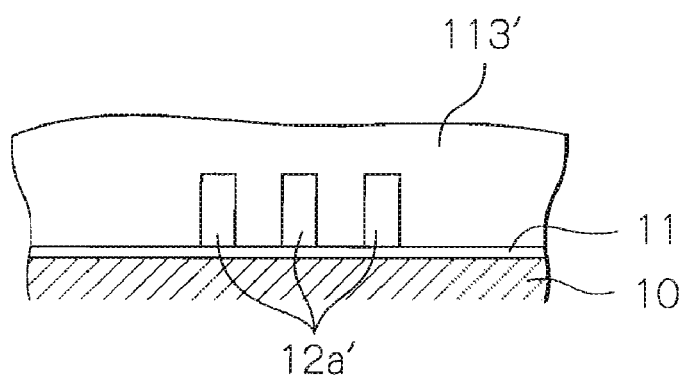
Figure 12D:
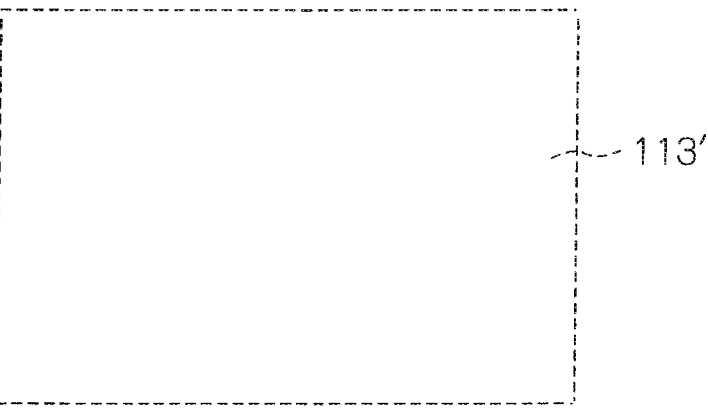

Then, a metal layer 113' having the trench pattern shown in FIGS. 11b and 12d and extending to its peripheral area is formed by performing a flame plating using this resist pattern layer 12 and the electrode film 11. This frame plating is conducted for a long period of time so that Ni or other metal material for example is plated using a Watt bath for example to have a thickness of about 21 μm, and that not only spaces in the trench forming portion 12a' of the resist pattern layer 12 is filled with the metal layer 113' but also the trench forming portion 12a' is completely covered by the metal layer 113', in other words, the trench forming portion 12a' is buried in the metal layer 113'. Instead of a long time period of plating or with a long time period of plating, increased plating current and/or increased metal-ion density of plating solution may be employed.

Figure 11C:
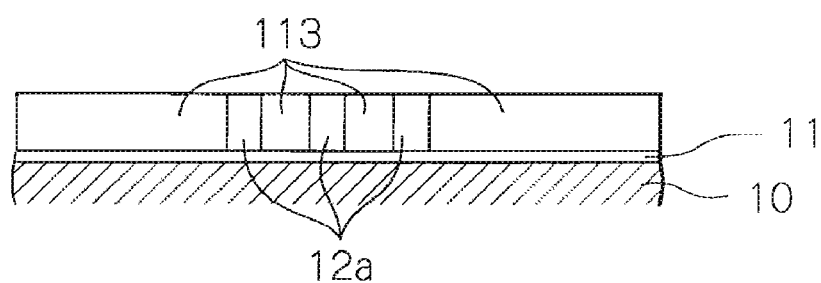
Figure 12E:
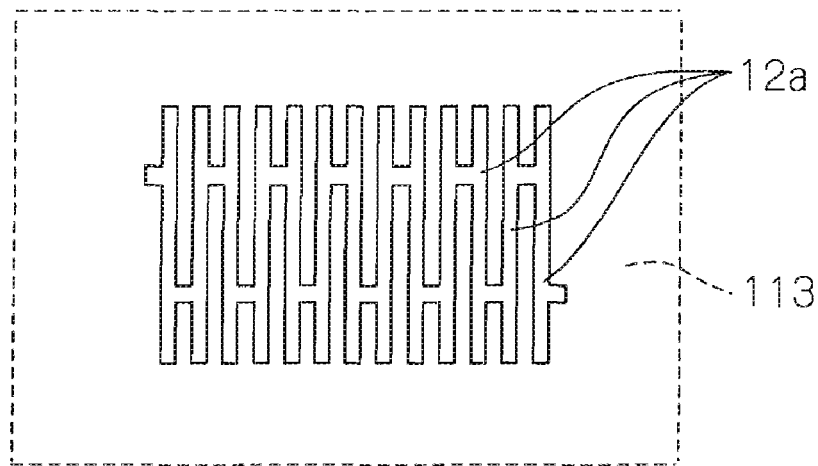

Then, a surface of the metal layer 113' is planarized by performing a CMP. In this embodiment, the CMP may be performed using a CMP device such as for example MIRRA of Applied Materials Inc. In the CMP process, a urethane pad is used with aluminum slurry having a grain diameter of 250 nm. This planarization process will be continued until the trench forming portion 12a' of the resist pattern layer 12 is exposed. As a result, as shown in FIGS. 11c and 12e, a metal layer 113 and a trench forming portion 12a of the resist pattern layer, with top surfaces planarized flat together in the same plane.

Figure 11D:
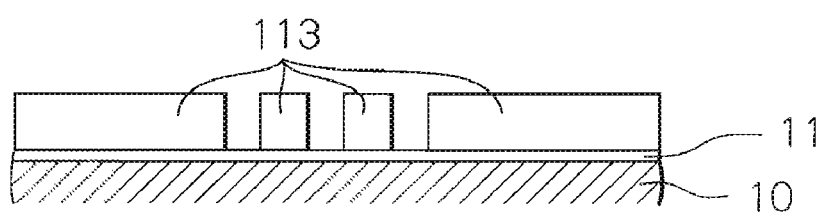
Figure 12F:
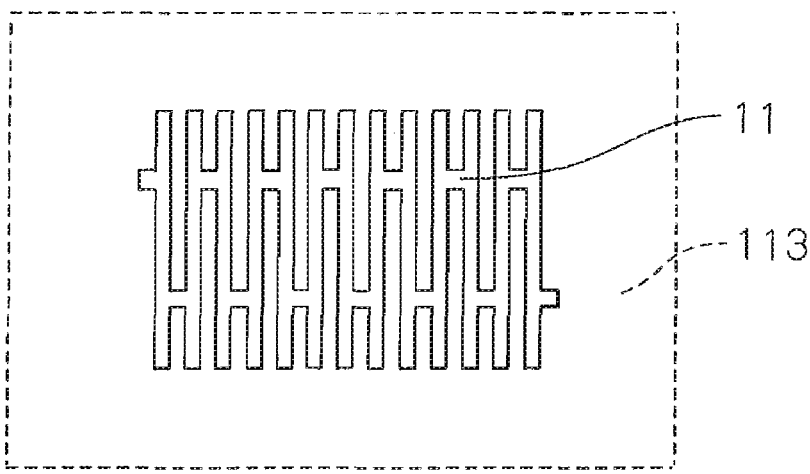
Figure 12G:
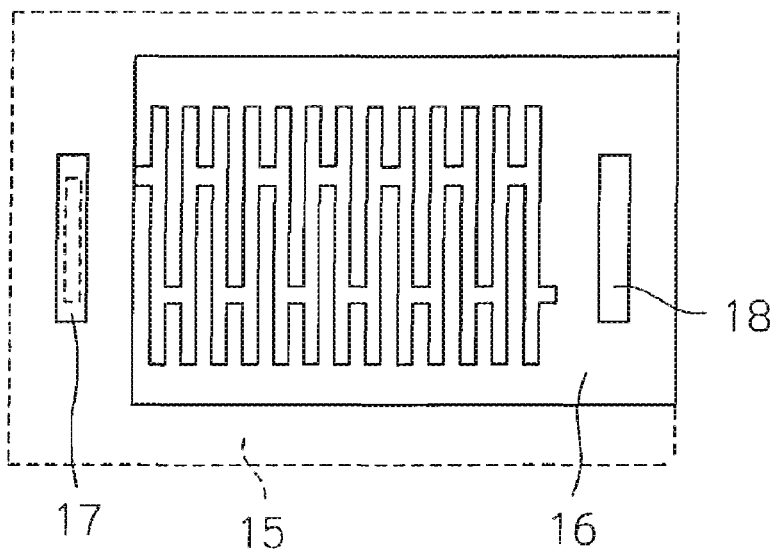

Then, as shown in FIGS. 11d and 12f, the trench forming portion 12a of the resist pattern is removed. This removal may be performed by immersing the substrate into an organic solution such as for example IPL or NMP and by rocking the immersed substrate.

According to the above-mentioned processes, the metal layer 113 having a trench pattern of a plurality of convex portions or pillars arranged to sandwich concave portions or recesses with a depth of about 20 μm, surrounded by its peripheral area part, can be obtained. The convex portions or pillars of the metal layer 113 are electrically conducted with each other through the electrode film 11. Particularly, in this embodiment, since the concave portions or recesses are filled with the resist pattern layer until the CMP planarization is finished, it is possible to prevent slurry used in CMP or lapped material from entering into the concave portions or recesses of the trench pattern, and to prevent the convex portions or pillars that configure the trench pattern by sandwiching the concave portions or recesses there between from being deformed or toppled over. According to this embodiment, the top surfaces of the convex portions or pillars and the peripheral area part of the metal layer 113 are even as shown FIG. 11d.

Figure 11E:
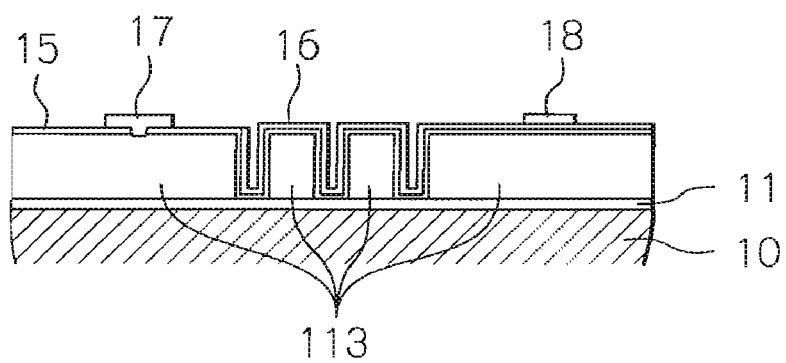

After forming such trench pattern, in this embodiment, a dielectric film 15 is formed on the top surface of the metal layer 113 by depositing thereon, by sputtering, a dielectric material such as for example $Al_2O_3$ to have a thickness of about 80 nm. Then, an upper electrode film 16 is formed by depositing thereon, by sputtering, two conductive materials such as for example Cr and Cu to have a thickness of about 10 nm and a thickness of about 500 nm, respectively. Thereafter, electrode pads 17 and 18 that are electrically connected to the metal layer 113 constituting a lower electrode and to the upper electrode film 16, respectively, are formed. As a result, as shown in FIGS. 11e and 11g, a trench capacitor is fabricated.

As described in detail, according to this embodiment, because the trench pattern is formed in a correct shape without deformation, a trench capacitor with high accuracy and high quality can be provided.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A method of forming a metal trench pattern in a thin-film device, comprising the steps of:

depositing an electrode film on a substrate or on a base layer;

forming a resist pattern layer having a trench-forming portion used to make a trench pattern, on the deposited electrode film;

forming a metal layer for filling spaces in said trench-forming portion and for covering said trench-forming portion, by performing plating through the formed resist pattern layer using the deposited electrode film as an electrode;

removing a part of the resist pattern layer and a part of the electrode film, which are uncovered by the formed metal layer;

depositing a peripheral area layer on the metal layer;

planarizing top surfaces of the formed metal layer and the deposited peripheral area layer until said trench-forming portion of said resist pattern layer is at least exposed; and removing the exposed trench-forming portion of said resist pattern layer.

2. The method as claimed in claim 1, wherein the step of depositing a peripheral area layer comprises depositing an insulation layer.

3. A method of forming a metal trench pattern in a thin-film device, comprising the steps of:
- depositing an electrode film on a substrate or on a base layer;
- forming a resist pattern layer having a trench-forming portion used to make a trench pattern, on the deposited electrode film;
- forming a metal layer for filling spaces in said trench-forming portion and for covering said trench-forming portion, by performing plating through the formed resist pattern layer using the deposited electrode film as an electrode;
- planarizing a top surface of only the formed metal layer until said trench-forming portion of said resist pattern layer is at least exposed; and
- removing the exposed trench-forming portion of said resist pattern layer.

4. A method of forming a metal trench pattern in a thin-film device, comprising the steps of:
- depositing an electrode film on a substrate or on a base layer;
- forming a resist pattern layer having a trench-forming portion used to make a trench pattern, on the deposited electrode film;
- forming a first metal layer made of a first metal material for filling spaces in said trench-forming portion, by performing plating through the formed resist pattern layer using the deposited electrode film as an electrode;
- forming a second metal layer made of a second metal material for covering at least said trench-forming portion, by performing plating through the formed resist pattern layer using the deposited electrode film as an electrode, said second metal material having a higher chemical activity than that of said first metal material;
- planarizing at least a top surface of the formed second metal layer just before said trench-forming portion of said resist pattern layer is exposed;
- removing said second metal layer to expose said trench-forming portion of said resist pattern layer; and
- removing the exposed trench-forming portion of said resist pattern layer.

5. The method as claimed in claim 4, wherein said method further comprises a step of removing a part of the resist pattern layer and a part of the electrode film, which are uncovered by the formed first and second metal layers, and a step of depositing a peripheral area layer on the second metal layer, and wherein the planarizing step comprises planarizing top surfaces of the formed second metal layer and the deposited peripheral area layer just before said trench-forming portion of said resist pattern layer is exposed.

6. The method as claimed in claim 5, wherein the step of depositing a peripheral area layer comprises depositing an insulation layer.

7. The method as claimed in claim 4, wherein the planarizing step comprises planarizing a top surface of only the formed second metal layer just before said trench-forming portion of said resist pattern layer is exposed.

8. A method of forming a metal trench pattern in a thin-film device, comprising the steps of:
- depositing an electrode film on a substrate or on a base layer;
- forming a resist pattern layer having a trench-forming portion used to make a trench pattern, on the deposited electrode film;
- forming a first metal layer made of a first metal material for filling spaces in said trench-forming portion, by performing plating through the formed resist pattern layer using the deposited electrode film as an electrode;
- shaving by an ashing process a top surface of the formed resist pattern layer;
- forming a second metal layer made of a second metal material for covering at least said trench-forming portion, by performing plating through the shaved resist pattern layer using the deposited electrode film as an electrode, said second metal material having a higher chemical activity than that of said first metal material;
- planarizing top surfaces of the formed first and second metal layers just before said trench-forming portion of said resist pattern layer is exposed;
- removing said second metal layer to expose said trench-forming portion of said resist pattern layer; and
- removing the exposed trench-forming portion of said resist pattern layer.

9. The method as claimed in claim 8, wherein said method further comprises a step of removing a part of the resist pattern layer and a part of the electrode film, which are uncovered by the formed first and second metal layers, and a step of depositing a peripheral area layer on the second metal layer, and wherein the planarizing step comprises planarizing top surfaces of the formed first and second metal layers and of the deposited peripheral area layer just before said trench-forming portion of said resist pattern layer is exposed.

10. The method as claimed in claim 9, wherein the step of depositing a peripheral area layer comprises depositing an insulation layer.

11. The method as claimed in claim 8, wherein the planarizing step comprises planarizing top surfaces of only the formed first and second metal layers just before said trench-forming portion of said resist pattern layer is exposed.

12. A manufacturing method of a thin-film device, comprising the steps of:
- depositing an electrode film on a substrate or on a base layer;
- forming a resist pattern layer having a trench-forming portion used to make a trench pattern, on the deposited electrode film;
- forming a metal layer for filling spaces in said trench-forming portion and for covering said trench-forming portion, by performing plating through the formed resist pattern layer using the deposited electrode film as an electrode;
- removing a part of the resist pattern layer and a part of the electrode film, which are uncovered by the formed metal layer;
- depositing a peripheral area layer on the metal layer;
- planarizing top surfaces of the formed metal layer and the deposited peripheral area layer until said trench-forming portion of said resist pattern layer is at least exposed; and
- removing the exposed trench-forming portion of said resist pattern layer.

13. The manufacturing method as claimed in claim 12, wherein said manufacturing method further comprises a step of depositing a dielectric film on the surface of the metal layer after the removing step of the resist pattern layer, and a step of depositing an upper electrode film on a surface of said dielectric film.

14. The manufacturing method as claimed in claim 12, wherein the step of depositing a peripheral area layer comprises depositing an insulation layer.

15. A manufacturing method of a thin-film device, comprising the steps of:

depositing an electrode film on a substrate or on a base layer;

forming a resist pattern layer having a trench-forming portion used to make a trench pattern, on the deposited electrode film;

forming a metal layer for filling spaces in said trench-forming portion and for covering said trench-forming portion, by performing plating through the formed resist pattern layer using the deposited electrode film as an electrode;

planarizing a top surface of only the formed metal layer until said trench-forming portion of said resist pattern layer is at least exposed; and removing the exposed trench-forming portion of said resist pattern layer.

16. A manufacturing method of a thin-film device, comprising the steps of:

depositing an electrode film on a substrate or on a base layer;

forming a resist pattern layer having a trench-forming portion used to make a trench pattern, on the deposited electrode film;

forming a first metal layer made of a first metal material for filling spaces in said trench-forming portion, by performing plating through the formed resist pattern layer using the deposited electrode film as an electrode;

forming a second metal layer made of a second metal material for covering at least said trench-forming portion, by performing plating through the formed resist pattern layer using the deposited electrode film as an electrode, said second metal material having a higher chemical activity than that of said first metal material;

planarizing at least a top surface of the formed second metal layer just before said trench-forming portion of said resist pattern layer is exposed;

removing said second metal layer to expose said trench-forming portion of said resist pattern layer; and removing the exposed trench-forming portion of said resist pattern layer.

17. The manufacturing method as claimed in claim 16, wherein said manufacturing method further comprises a step of depositing a dielectric film on the surface of the first metal layer after the removing step of the resist pattern layer, and a step of depositing an upper electrode film on a surface of said dielectric film.

18. The manufacturing method as claimed in claim 16, wherein said manufacturing method further comprises a step of removing a part of the resist pattern layer and a part of the electrode film, which are uncovered by the formed first and second metal layers, and a step of depositing a peripheral area layer on the second metal layer, and wherein the planarizing step comprises planarizing top surfaces of the formed second metal layer and the deposited peripheral area layer just before said trench-forming portion of said resist pattern layer is exposed.

19. The manufacturing method as claimed in claim 18, wherein the step of depositing a peripheral area layer comprises depositing an insulation layer.

20. The manufacturing method as claimed in claim 16, wherein the planarizing step comprises planarizing a top surface of only the formed second metal layer just before said trench-forming portion of said resist pattern layer is exposed.

21. A manufacturing method of a thin-film device, comprising the steps of:

depositing an electrode film on a substrate or on a base layer;

forming a resist pattern layer having a trench-forming portion used to make a trench pattern, on the deposited electrode film;

forming a first metal layer made of a first metal material for filling spaces in said trench-forming portion, by performing plating through the formed resist pattern layer using the deposited electrode film as an electrode;

shaving by an ashing process a top surface of the formed resist pattern layer;

forming a second metal layer made of a second metal material for covering at least said trench-forming portion, by performing plating through the shaved resist pattern layer using the deposited electrode film as an electrode, said second metal material having a higher chemical activity than that of said first metal material;

planarizing top surfaces of the formed first and second metal layers just before said trench-forming portion of said resist pattern layer is exposed;

removing said second metal layer to expose said trench-forming portion of said resist pattern layer; and removing the exposed trench-forming portion of said resist pattern layer.

22. The manufacturing method as claimed in claim 21, wherein said manufacturing method further comprises a step of depositing a dielectric film on the surface of the first metal layer after the removing step of the resist pattern layer, and a step of depositing an upper electrode film on a surface of said dielectric film.

23. The manufacturing method as claimed in claim 21, wherein said manufacturing method further comprises a step of removing a part of the resist pattern layer and a part of the electrode film, which are uncovered by the formed first and second metal layers, and a step of depositing a peripheral area layer on the second metal layer, and wherein the planarizing step comprises planarizing top surfaces of the formed first and second metal layers and of the deposited peripheral area layer just before said trench-forming portion of said resist pattern layer is exposed.

24. The manufacturing method as claimed in claim 23, wherein the step of depositing a peripheral area layer comprises depositing an insulation layer.

25. The manufacturing method as claimed in claim 21, wherein the planarizing step comprises planarizing top surfaces of only the formed first and second metal layers just before said trench-forming portion of said resist pattern layer is exposed.

* * * * *